(12) United States Patent
Park et al.

(10) Patent No.: US 11,195,861 B2
(45) Date of Patent: Dec. 7, 2021

(54) DISPLAY DEVICE AND METHOD OF MANUFACTURING THE SAME

(71) Applicant: Samsung Display Co., LTD., Yongin-si (KR)

(72) Inventors: Geun Chul Park, Suwon-si (KR); Joon Seok Park, Yongin-si (KR); Tae Sang Kim, Seoul (KR); Yeon Keon Moon, Hwaseong-si (KR); Jun Hyung Lim, Seoul (KR); Kyung Jin Jeon, Incheon (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/818,310

(22) Filed: Mar. 13, 2020

(65) Prior Publication Data

US 2020/0343275 A1    Oct. 29, 2020

(30) Foreign Application Priority Data

Apr. 26, 2019    (KR) .......................... 10-2019-0048828

(51) Int. Cl.
*H01L 27/00* (2006.01)
*H01L 29/00* (2006.01)
*H01L 27/12* (2006.01)

(52) U.S. Cl.
CPC ...... *H01L 27/1225* (2013.01); *H01L 27/1259* (2013.01)

(58) Field of Classification Search
CPC ............ H01L 27/1248; H01L 27/1259; H01L 27/1225; H01L 27/3262; H01L 29/78648; H01L 29/7869; H01L 29/786; H01L 29/51
See application file for complete search history.

(56) References Cited

U.S. PATENT DOCUMENTS

| 10,297,622 | B2 * | 5/2019 | Na .................. H01L 29/7869 |
| 10,580,904 | B2 * | 3/2020 | Lee .................. H01L 29/41733 |
| 2018/0061868 | A1 * | 3/2018 | Na ................... H01L 29/42384 |
| 2019/0043997 | A1 * | 2/2019 | Lee ...................... G09G 3/3291 |

FOREIGN PATENT DOCUMENTS

| KR | 10-2015-0002279 | 1/2015 |
| KR | 10-2018-0024817 | 3/2018 |
| KR | 10-2018-0061723 | 6/2018 |
| KR | 10-2018-0070334 | 6/2018 |
| KR | 10-2018-0097782 | 8/2018 |

* cited by examiner

*Primary Examiner* — Nikolay K Yushin
(74) *Attorney, Agent, or Firm* — Kile Park Reed & Houtteman PLLC

(57) ABSTRACT

A display device and a method of manufacturing the same. The display device includes a pixel connected to a scan line and a data line intersecting the scan line, and a driving transistor and a switching transistor disposed in the pixel. The driving transistor includes a substrate, a first active layer disposed on the substrate, a first gate electrode disposed on the first active layer, and a second insulating film contacting the first gate electrode and the first gate electrode. The switching transistor includes a second active layer disposed on the substrate, a second gate electrode disposed on the second active layer, a first insulating film contacting the second active layer and the second gate electrode, and a second insulating film covering the first insulating film. The first insulating film and the second insulating film are made of different materials from each other.

24 Claims, 21 Drawing Sheets

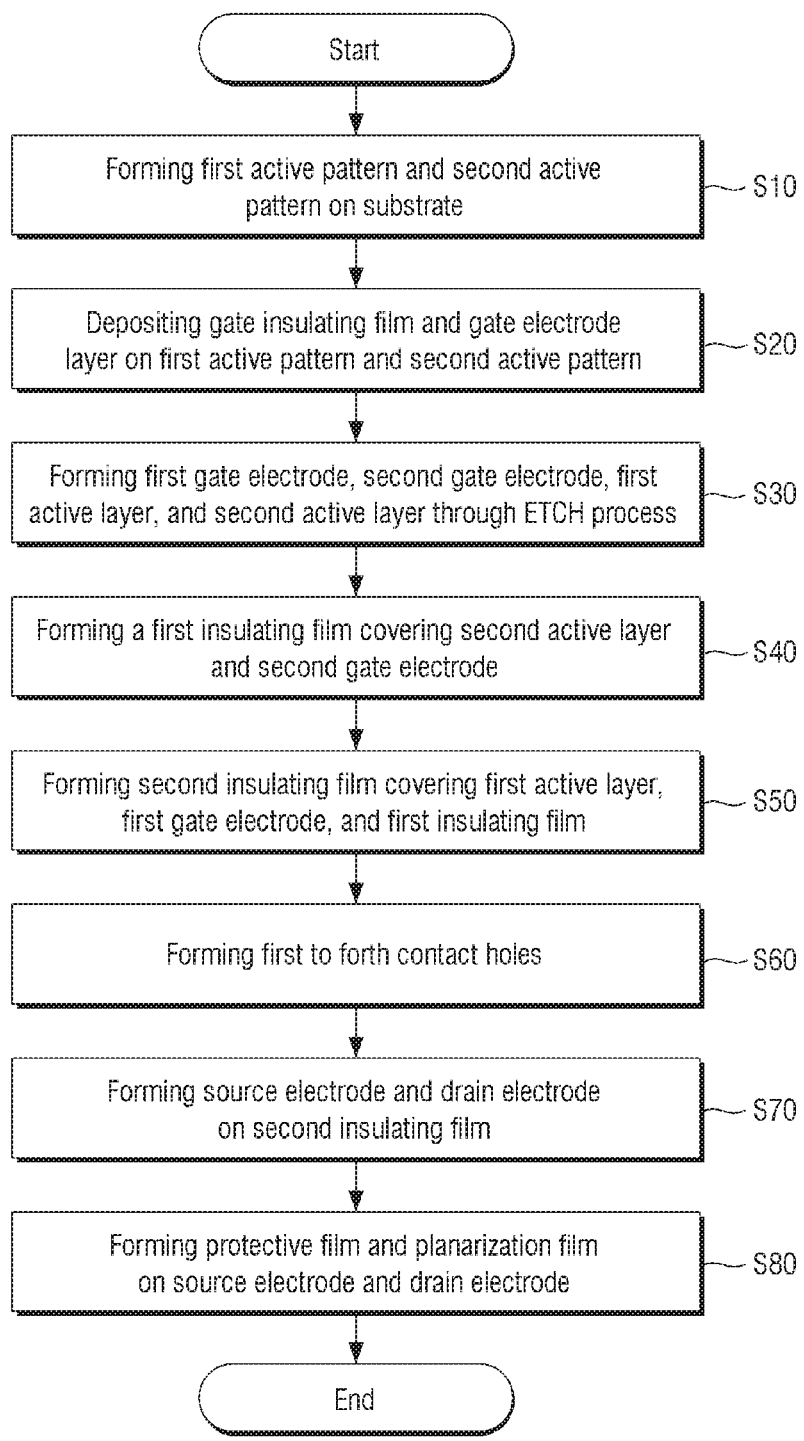

DISPLAY DEVICE AND METHOD OF MANUFACTURING THE SAME

CROSS-REFERENCE TO RELATED APPLICATIONS

This application claims priority from Korean Patent Application No. 10-2019-0048828, filed on Apr. 26, 2019 in the Korean Intellectual Property Office, and all the benefits accruing therefrom under 35 U.S.C. § 119, the disclosure of which is incorporated herein by reference in its entirety.

BACKGROUND

1. Field

Examples relate to a display device and a method of manufacturing the same.

2. Description of the Related Art

With the development of information society, requirements for display devices for displaying images have increased in various forms. Accordingly, in recent years, various types of display devices such as a liquid crystal display (LCD), a plasma display panel (PDP), and a light emitting display (LED) haven been utilized. A light emitting display (LED) generally includes an organic light emitting display using an organic light emitting diode as a light emitting element, and a light emitting diode display using a micro light emitting diode as a light emitting element.

Such flat panel displays generally include a display panel, a gate driving circuit, a data driving circuit, and a timing controller. The display panel includes data lines, gate lines, and pixels formed at intersections of the data lines and the gate lines. Each of the pixels receives a data voltage from the data line when a gate signal is supplied to the gate line using a thin film transistor as a switching element. Each of the pixels emits light at a predetermined brightness according to data voltages.

Recently, flat panel display devices capable of displaying images at a high resolution of ultra high definition (UHD) have been introduced, and flat panel displays capable of displaying images at a high resolution of 8K ultra high definition (8K UHD) have been developed. UHD represents a resolution of 3840×2160, and 8K UHD represents a resolution of 7680×4320.

For the high-resolution flat panel display devices, as the number of pixels increases, it is required to improve the characteristics of a scan driving circuit and an in-pixel thin film transistor.

SUMMARY

In varying embodiments, provided are a display device capable of improving the mobility of a scan driving circuit and a switching transistor and increasing the driving range of a driving transistor, and a method of manufacturing the same.

However, the varying embodiments are not restricted to the one set forth herein. The varying embodiments will become apparent to one of ordinary skill in the art by referencing the detailed description given below.

In an embodiment, a display device may include a pixel connected to a scan line and a data line intersecting the scan line, and a driving transistor and a switching transistor disposed in the pixel. The driving transistor may include a substrate, a first active layer disposed on the substrate, a first gate electrode disposed on the first active layer, and a second insulating film contacting the first gate electrode and the first gate electrode. The switching transistor may include a second active layer disposed on the substrate, a second gate electrode disposed on the second active layer, a first insulating film contacting the second active layer and the second gate electrode, and a second insulating film covering the first insulating film. The first insulating film may be made of a different material than a material of the second insulating film.

In an embodiment, the first insulating film may include a silicon nitride (SiNx) film, and the second insulating film may include a silicon oxide (SiOx) film.

In an embodiment, the first insulating film may be in contact with upper and side surfaces of the second gate electrode and upper and side surfaces of the second active layer.

In an embodiment, a thickness of the first insulating film may be greater than a thickness of the second insulating film of the switching transistor.

In an embodiment, each of the first active layer and the second active layer may include indium-gallium-tin oxide (IGTO), indium-gallium-zinc oxide (IGZO), or indium-gallium-zinc-tin oxide (IGZTO).

In an embodiment, the driving transistor may further include a first lower metal layer disposed between the substrate and the first active layer, and the switching transistor may further include a second lower metal layer disposed between the substrate and the second active layer.

In an embodiment, the first active layer may include a first source region, a first drain region, and a first channel region disposed between the first source region and the first drain region, and the second active layer may include a second source region, a second drain region, and a second channel region disposed between the second source region and the second drain region.

In an embodiment, the driving transistor may further include a first source electrode connected to the first source region of the first active layer through a first contact hole penetrating the second insulating film of the driving transistor, and a first drain electrode connected to the first drain region of the first active layer through a second contact hole penetrating the second insulating film of the driving transistor.

In an embodiment, the switching transistor may further include a second source electrode connected to the second source region of the second active layer through a third contract hole penetrating the first insulating film and the second insulating film of the switching transistor, and a second drain electrode connected to the second drain region of the second active layer through a fourth contract hole penetrating the first insulating film and the second insulating film of the switching transistor.

In an embodiment, the display device may further include a buffer film disposed between the first lower metal layer and the first active layer, wherein the driving transistor may further include a fifth contact hole penetrating the second insulating film of the driving transistor and the buffer film, and the second source electrode is connected to the first lower metal layer through the fifth contact hole.

In an embodiment, the display device may further include a sixth contact hole exposing the second active layer, wherein the second gate electrode is connected to the second lower metal layer through the sixth contact hole.

In an embodiment, the first contact hole, the second contact hole, and the fifth contact hole may be aligned in a first direction.

In an embodiment, the third contact hole and the fourth contact hole may be aligned in the first direction, and the sixth contact hole is not aligned with the third contact hole and the fourth contact hole in the first direction.

In an embodiment, a length of the first lower metal layer in a first direction may be greater than a length of the first active layer in the first direction, and a length of the second lower metal layer in the first direction may be greater than a length of the first active layer in the first direction.

In an embodiment, the display device may further comprise a scan driving circuit outputting a scan signal to the scan line, wherein the scan driving circuit may include a pull-up transistor that outputs a gate-on voltage in response to a pull-up node being charged with the gate-on voltage, and the pull-up transistor may include a third active layer disposed on the same layer as the second active layer and a third gate electrode disposed on the second active layer.

In an embodiment, the third active layer may include indium-gallium-tin oxide (IGTO), indium-gallium-zinc oxide (IGZO), or indium-gallium-zinc-tin oxide (IGZTO).

In another embodiment, a method of manufacturing a display device may include forming a first active layer and a second active layer on a substrate, forming a first gate electrode on the first active layer and forming a second gate electrode on the second active layer, forming a first insulating film covering the second active layer and the second gate electrode, and forming a second insulating film covering the first active layer, the first gate electrode, and the first insulting film.

In an embodiment, each of the first active layer and the second active layer may include indium-gallium-tin oxide (IGTO), indium-gallium-zinc oxide (IGZO), or indium-gallium-zinc-tin oxide (IGZTO).

In an embodiment, the first insulating film may be formed of a silicon nitride (SiNx) film, and the second insulating film may be formed of a silicon oxide (SiOx) film.

In an embodiment, the method of manufacturing the display device may further include forming a first lower metal layer between the substrate and the first active layer; and forming a second lower metal layer between the substrate and the first active layer.

BRIEF DESCRIPTION OF THE DRAWINGS

The above and other embodiments will become apparent by describing in detail examples thereof with reference to the attached drawings, in which:

FIG. 21 is a flow chart to explain the method of manufacturing a display device according to an embodiment.

DETAILED DESCRIPTION OF THE EMBODIMENTS

Figure 1:
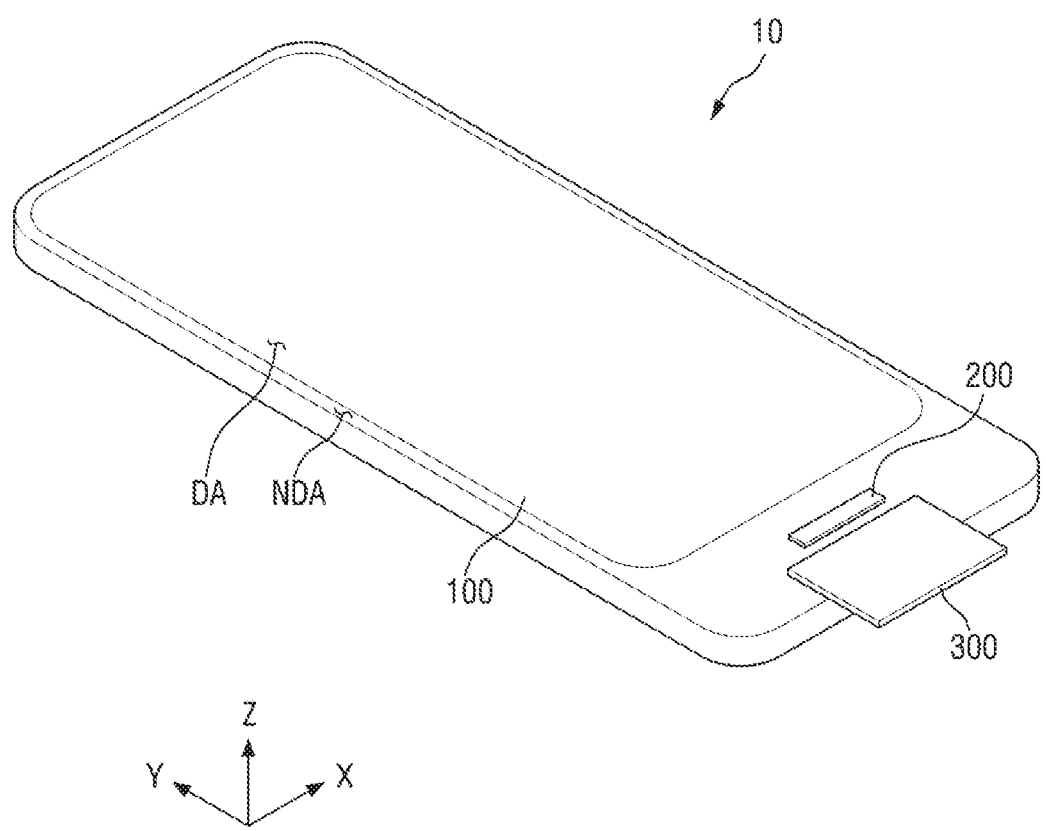
FIG. 1 is a perspective view of a display device according to an embodiment.

Devices and methods will now be described more fully hereinafter with reference to the accompanying drawings, in which examples are shown. This invention may, however, be embodied in different forms and should not be construed as limited to the examples set forth herein. Rather, these examples are provided so that this disclosure will be thorough and complete. The scope of this disclosure should be construed as including all the changes, equivalents and substitutions included in the spirit and scope of the invention.

It will also be understood that when a layer or element is referred to as being "on" another layer or substrate, it can be directly on the other layer or substrate, or intervening layers may also be present. The same reference numbers indicate the same components throughout the specification.

In this specification, the "on", "over", "top", "upper side", or "upper surface" may refer to an upward direction, that is, a Z-axis direction, with respect to a display panel, and the "beneath", "under", "bottom", "lower side", or "lower surface" may refer to a downward direction, that is, a direction opposite to the Z-axis direction, with respect to the display panel. Further, the "left", "right", "upper", and "lower" may refer to directions when the display panel is viewed from the plane. For example, the "left" may refer to a direction opposite to the X-axis direction, the "right" may refer to the X-axis direction, the "upper" may refer to the Y-axis direction, and the "lower" may refer to a direction opposite to the Y-axis direction. However, it will be understood that these terms are spatially relative terms, and that such terms are also mean to encompass different orientations of a device in use or operation, in addition to the orientation depicted in the drawings. When an element is referred to as being "connected" to another element, the element may be "directly connected" to another element, or "electrically connected" to another element with one or more intervening elements interposed therebetween. When the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof. Although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein. Finally, unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the attached drawings. The same reference numbers indicate the same components throughout the specification.

Figure 2:
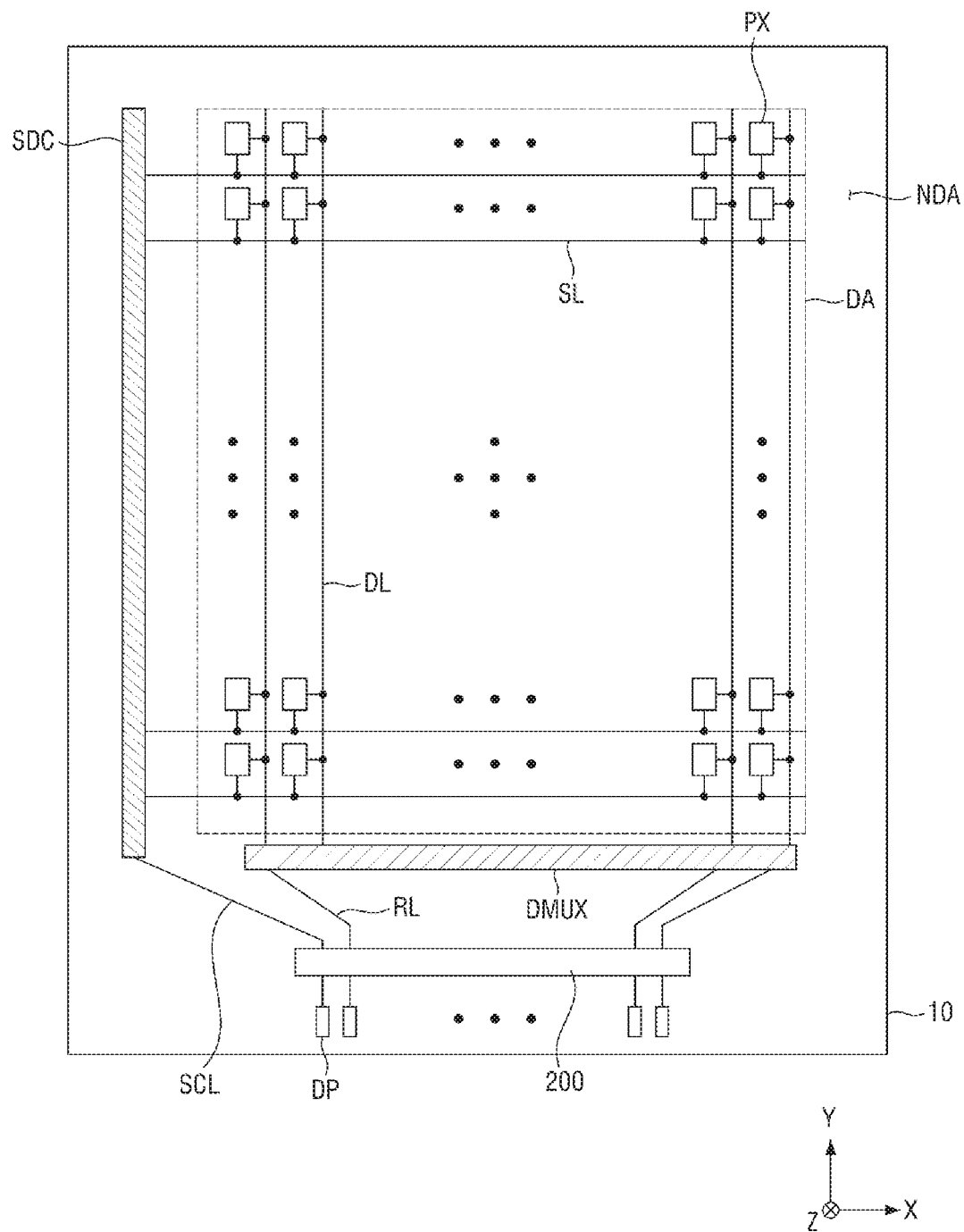
FIG. 2 is a plan view of a display device according to an embodiment.

FIG. 1 is a perspective view of a display device according to an example, and FIG. 2 is a plan view of a display device according to an example. Referring to FIGS. 1 and 2, a display device 10, which may be a device for displaying a moving image or a still image, may be used as a display screen of various products. Examples of the products may include televisions, notebooks, monitors, billboards, internet of things (IOTs) as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra mobile PCs (UMPCs). The display device 10 may be an organic light emitting display device, a liquid crystal display device, a plasma display device, a field emission display device, an electrophoretic display device, an electrowetting display device, a quantum dot light emitting display device, a micro LED display device, or the like. Hereinafter, the display device 10 will be mainly described as an organic light emitting display device, but the embodiments are not limited thereto.

The display device 10 according to an example may include a display panel 100, a display driving circuit 200, and a circuit board 300.

The display panel 100 may have a rectangular planar shape having short sides in a first direction (X-axis direction) and long sides in a second direction (Y-axis direction). A corner where the short side in the first direction (X-axis direction) meets the long side in the second direction (Y-axis direction) may be formed to have a round shape of a predetermined curvature or have a right angle shape. The planar shape of the display panel 100 is not limited to a rectangular shape, and may be formed in a polygonal shape, a circular shape, or an elliptical shape. The display panel 100 may be formed to be flat. However, embodiments are not limited thereto. The display panel 100 may include a curved portion formed at the left and right ends thereof and having a constant curvature or a variable curvature. The display panel 100 may be flexible to be bent, warped, folded, or rolled.

The display panel 100 may include a display area DA in which pixels PX are formed to display an image, and a non-display area NDA which is a peripheral area of the display area DA. When the display panel 100 includes a curved surface portion, the display area DA may be disposed in the curved surface portion. The image of the display panel 100 may also be seen on the curved surface portion.

The display area DA may be provided with scan lines SL, data lines DL, and power supply lines, which are connected to the pixels PX. The scan lines SL may be arranged in parallel in the first direction (X-axis direction), and the data lines DL may be arranged in parallel in the second direction (Y-axis Direction) intersecting the first direction (X-axis direction). Each of the pixels PX may be connected to a scan line SL and a data line DL.

Figure 3:
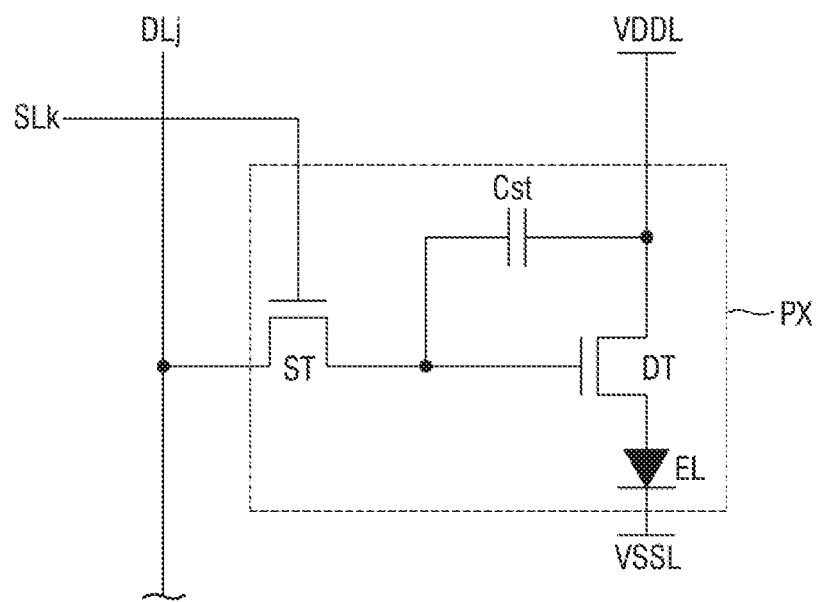
FIG. 3 is a circuit diagram showing an example of the pixel of FIG. 2.

Each of the pixels PX may include a driving transistor DT, a switching transistor ST, a light emitting element EL, and a capacitor Cst (referring to FIG. 3). The switching transistor ST may be turned on when a scan signal is applied from the scan line SL, and thus a data voltage of the data line DL may be applied to a gate electrode of the driving transistor DT. The driving transistor DT may supply a driving current to the light emitting element in accordance with the data voltage applied to the gate electrode, thereby emitting light. The driving transistor DT and the switching transistor ST may be thin film transistors. The light emitting element may emit light in accordance with the driving current of the driving transistor DT. The light emitting element may be an organic light emitting diode including a first electrode, an organic light emitting layer, and a second electrode. The capacitor may serve to keep the data voltage applied to the gate electrode of the driving transistor DT constant.

The non-display area NDA may be defined as an area from the outside of the display area DA to the edge of the display panel 100. The non-display area NDA may be provided with a scan driving circuit SDC for applying scan signals to the scan lines SL and a data voltage distribution circuit DMUX connected between the data lines DL and routing lines RL. Further, the non-display area NDA may be provided with the display driving circuit 200 and pads DP electrically connected to the circuit board 300. The display driving circuit 200 and the pads DP may be disposed at one side edge of the display panel 100.

The scan driving circuit SDC may be connected to the display driving circuit 200 through one or more scan control line SCL. The scan driving circuit SDC may receive a scan control signal from the display driving circuit 200 through the scan control line SCL. The scan driving circuit SDC may generate scan signals according to the scan control signal, and may sequentially output the scan signals to the scan lines SL. Although it is shown in FIG. 2 that the scan driving circuit SDC is in the non-display area NDA located at one side, for example, the left side of the display area DA, its position is not limited thereto. For example, the scan driving circuit SDC may be in the non-display area NDA located at both sides, for example, the left and right sides of the display area DA.

The data voltage distribution circuit DMUX may be connected between the routing lines RL and the data lines DL. The ratio of the number of the routing lines RL and the number of the data lines DL may be 1:q (q may be an integer of 2 or more). The data voltage distribution circuit DMUX may distribute the data voltages applied to one routing line RL to multiple data lines DL.

The display driving circuit 200 may be connected to the display pads DP to receive digital video data and timing signals. The display driving circuit 200 may convert the digital video data into analog positive/negative polarity data voltages and supply the analog positive/negative polarity data voltages to the data lines DL through the routing lines RL and the data voltage distribution circuit DMUX. Further, the display driving circuit 200 may generate and supply a scan control signal for controlling the scan driving circuit SDC through the scan control line SCL. Pixels PX to which the data voltages are to be supplied are selected by the scan signals of the scan driving circuit SDC, and data voltages are supplied to the selected pixels PX. Further, the display driving circuit 200 may supply power supply voltages to power supply lines.

The display driving circuit 200 may be formed as an integrated circuit (IC), and may be attached onto the display panel 100 by using a chip on glass (COG) method, a chip on plastic (COP) method, or an ultrasonic bonding method. But, its embodiments and method thereof are not limited thereto. For example, the display driving circuit 200 may be attached onto the circuit board 300.

The pads DP may be electrically connected to the display driving circuit 200. The circuit board 300 may be attached onto the pads DP using an anisotropic conductive film. Thus, lead lines of the circuit board 300 may be electrically connected to the pads DP. The circuit board 300 may be a flexible film such as a flexible printed circuit board, a printed circuit board, or a chip on film.

FIG. 3 is a circuit diagram showing an example of the pixel of FIG. 2.

Referring to FIG. 3, the pixel PX includes the driving transistor DT, the switching transistor ST, the light emitting element EL, and the capacitor Cst. This circuit diagram is a simplified drawing of an example. Embodiments of the pixel may have various circuits, for example, including two or more switching transistors.

Since the switching transistor ST may be turned on when a scan signal is applied from a $k_{th}$ scan line SLk (k is a positive integer), the data voltage of a $j_{th}$ data line DLj (j is a positive integer) may be applied to the gate electrode of the driving transistor DT. The gate electrode of the switching transistor ST may be connected to the $k_{th}$ scan line SLk, the source electrode thereof may be connected to the gate electrode of the driving transistor DT, and the drain electrode thereof may be connected to the $j_{th}$ data line DLj.

The driving transistor DT may emit light by supplying a driving current to the light emitting element in accordance with the data voltage applied to the gate electrode. The gate electrode of the driving transistor DT may be connected to the drain electrode of the switching transistor ST, the source electrode thereof may be connected to the first electrode of the light emitting element EL, and the drain electrode thereof may be connected to a first power supply line VDDL to which a first power supply voltage may be applied.

The driving transistor DT and the switching transistor ST may be thin film transistors. Although it is illustrated in FIG. 3 that the driving transistor DT and the switching transistor ST are formed as N-type semiconductor transistors having N-type semiconductor characteristics, their embodiments are not limited thereto. That is, the driving transistor DT and the switching transistor ST may be formed as P-type semiconductor transistors having P-type semiconductor characteristics.

The light emitting element EL may emit light in accordance with the driving current of the driving transistor DT. The light emitting element EL may be an organic light emitting diode including a first electrode, an organic light emitting layer, and a second electrode. The first electrode of the light emitting element EL may be connected to the drain electrode of the driving transistor DT, and the second electrode thereof may be connected to a second power supply line VSSL to which a second power supply voltage lower than the first power supply voltage may be applied.

The capacitor Cst may be connected between the gate electrode and source electrode of the driving transistor DT. Thus, the capacitor Cst may serve to keep the data voltage applied to the gate electrode of the driving transistor DT constant.

Figure 4:
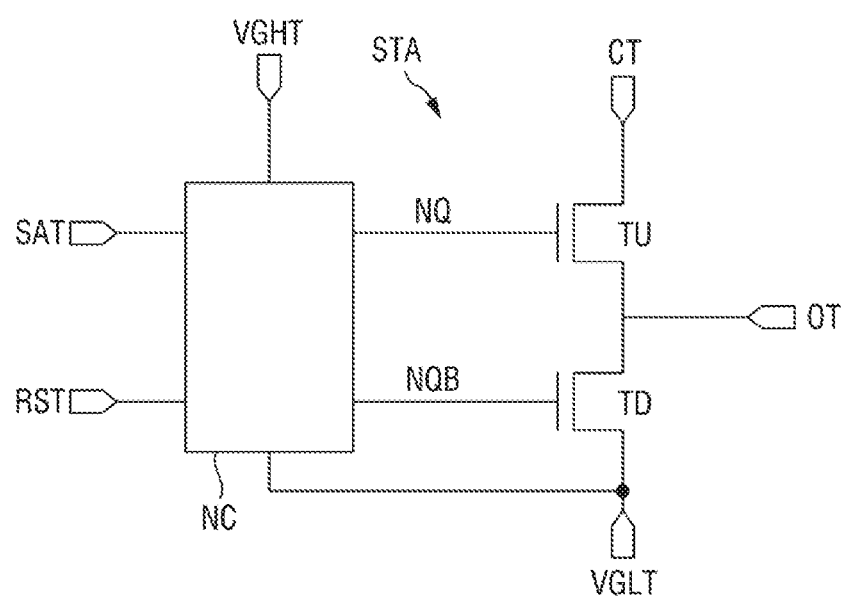
FIG. 4 is a circuit diagram showing an example of the scan driving circuit of FIG. 3.

FIG. 4 is a circuit diagram showing an example of the scan driving circuit of FIG. 2. As shown in FIG. 4, the scan driving circuit SDC may include stages STA that may be dependently connected. The stages STA may sequentially output scan signals to the scan lines SL. Each of the stages STA may include a pull-up transistor TU which may be turned on when a pull-up node NQ and a pull-down node NQB have gate-on voltages, a pull-down transistor TD which may be turned on when the pull-down node NQB has a gate-on voltage, and a node controller NC that may control the charging and discharging of the pull-up node NQ and the pull-down node NQB.

The node controller NC may be connected to a start terminal SAT to which a start signal or an output signal of the front stage may be inputted, a reset terminal RST to which an output signal of the rear stage may be inputted, a gate-on voltage terminal VGHT to which a gate-on voltage may be applied, and a gate-off voltage terminal VGLT to which a gate-off voltage may be applied. The node controller NC may control the charging and discharging of the pull-up node NQ and the pull-down node NQB in accordance with (or response to) the start signal input to the start terminal SAT or the output signal of the front stage. In order to stably control the output of the stage STA, the node controller NC may allow the pull-down node NQB to have a gate-off voltage when the pull-up node NQ has a gate-on voltage, and may allow the pull-up node NQ to have a gate-off voltage when the pull-down node NQB has a gate-on voltage or in response to the pull-down node NQB being charged with a gate-on voltage. The node controller NC may include one or more transistors.

When the stage STA is pulled-up, that is, when the pull-up node NQ has a gate-on voltage, the pull-up transistor TU may be turned on to output a clock signal input to a clock terminal CT to an output terminal OT. When the stage STA is pulled-down, for example, when the pull-down node NQB has a gate-on voltage, the pull-down transistor TD may be turned on to output a gate-off voltage of the gate-off voltage terminal VGLT to the output terminal OT.

The transistors of the pull-up transistor TU, pull-down transistor TD, and node controller NC of the stage STA may be formed as thin film transistors. It is illustrated in FIG. 4 that the transistors of the pull-up transistor TU, pull-down transistor TD, and node controller NC of the stage STA may be formed as N-type semiconductor transistors having N-type semiconductor characteristics. But, their embodiments are not limited thereto. In other examples, the transistors of the pull-up transistor TU, pull-down transistor TD, and node controller NC of the stage STA may be formed as P-type semiconductor transistors having P-type semiconductor characteristics.

Figure 5:
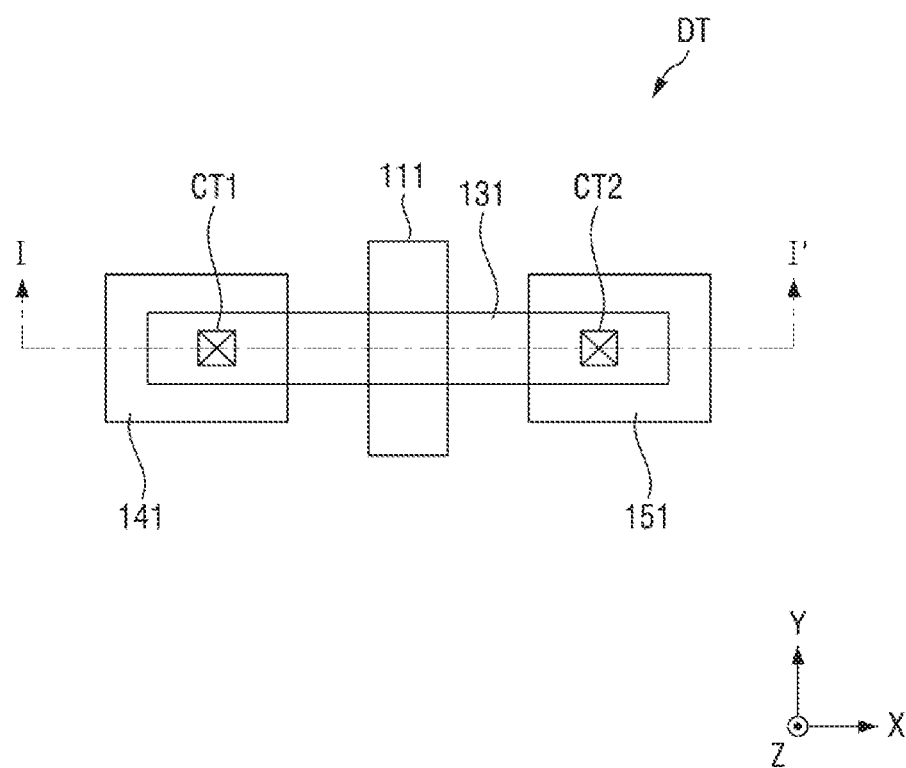
FIG. 5 is a plan view showing an example of a driving transistor of the pixel of FIG. 3.
Figure 6:
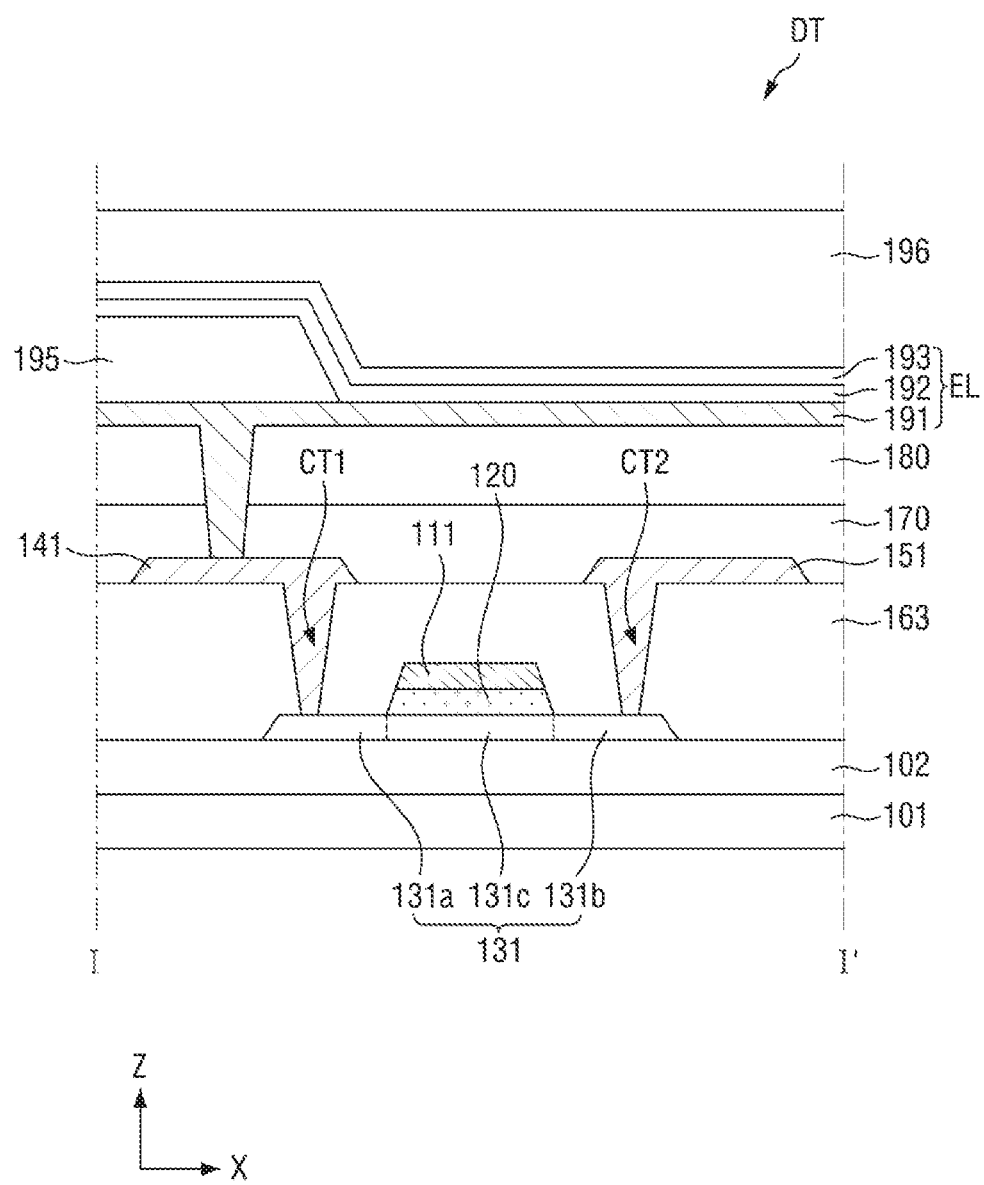
FIG. 6 is a cross-sectional view taken along the line I-I' of FIG. 5.
Figure 7:
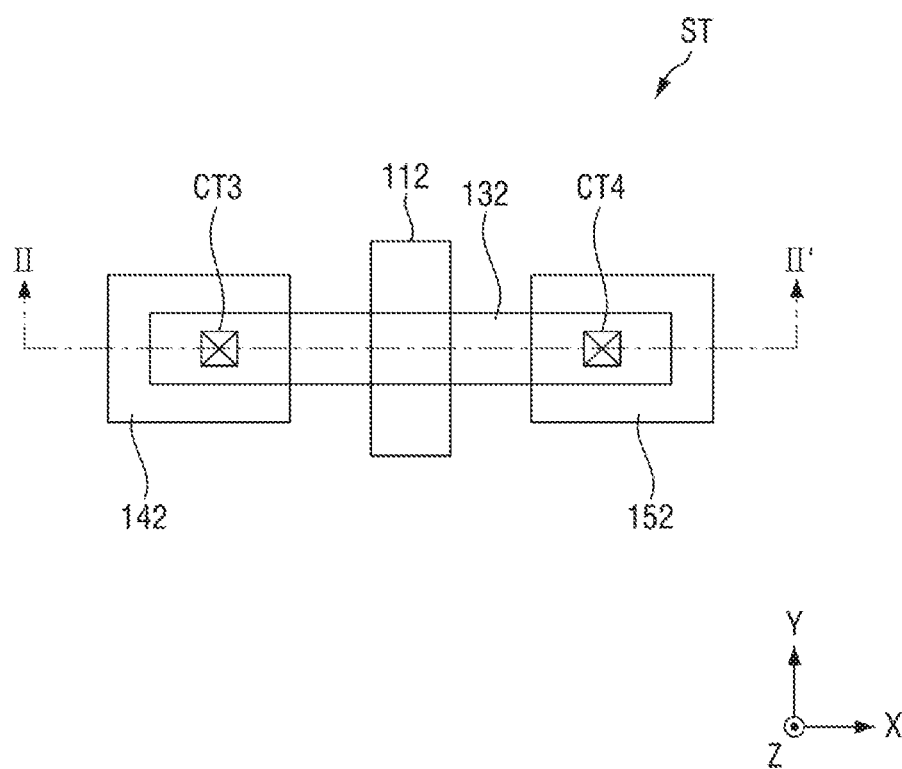
FIG. 7 is a plan view showing an example of a switching transistor of the pixel of FIG. 3.
Figure 8:
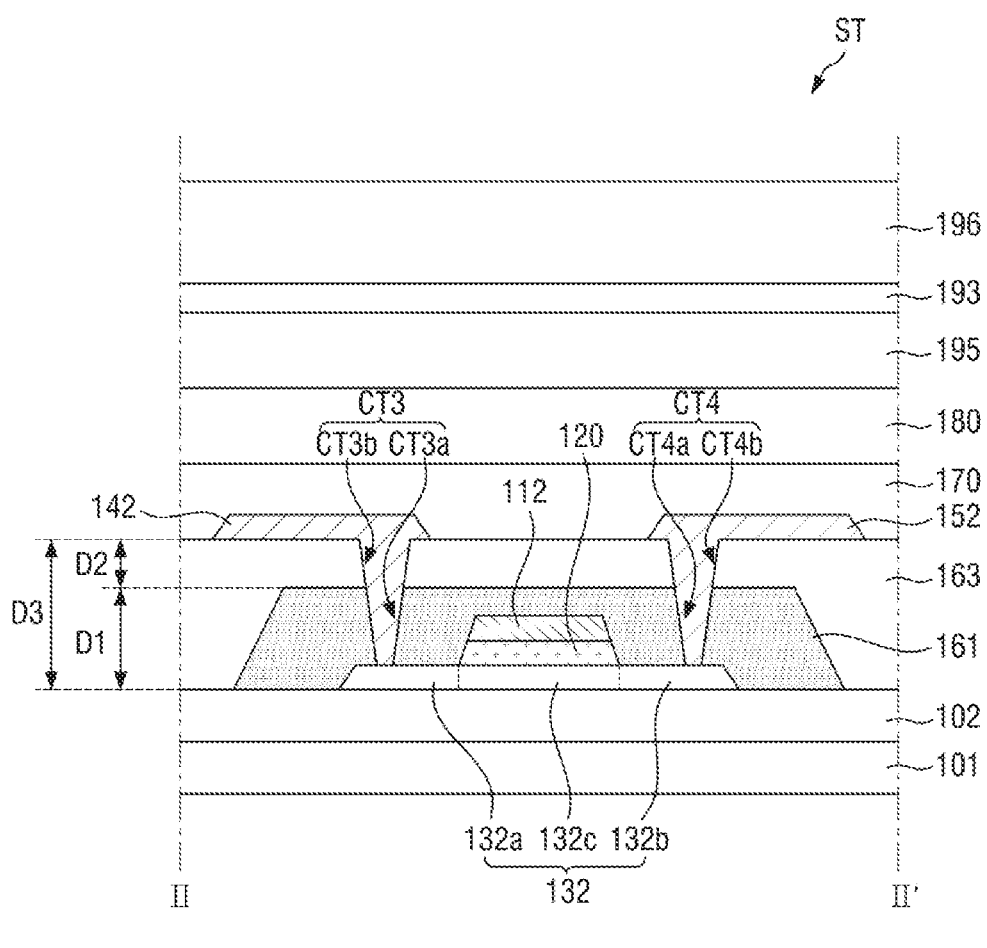
FIG. 8 is a cross-sectional view taken along the line II-II' of FIG. 7.

FIG. 5 is a plan view showing an example of a driving transistor of the pixel. FIG. 6 is a cross-sectional view taken along the line I-I' of FIG. 5. FIG. 7 is a plan view showing an example of a switching transistor of the pixel. FIG. 8 is a cross-sectional view taken along the line II-II' of FIG. 7. As shown in FIGS. 5 to 8, each of the driving transistor DT and switching transistor ST of the pixel PX may have a top gate structure in which a gate electrode may be formed on an active layer. Each of the driving transistor DT and the switching transistor ST may be formed to have a coplanar structure.

Referring to FIGS. 5 to 8, the driving transistor DT of the pixel PX may include a first gate electrode 111, a first active layer 131, a first source electrode 141 and a first drain electrode 151. The switching transistor ST of the pixel PX may include a second gate electrode 112, a second active layer 132, a second source electrode 142, and a second drain electrode 152. The driving transistor DT and the switching transistor ST may be disposed on a substrate 101.

The substrate 101 may be a rigid substrate or a flexible substrate capable of bending, folding, rolling, or the like. The substrate 101 may be made of an insulating material such as glass, quartz, or a polymer resin. Examples of the polymer resin may include polyethersulphone (PES), polyacrylate (PA), polyarylate (PAR), polyetherimide (PEI), polyethylenenapthalate (PEN), polyethylene terepthalate (PET), polyphenylenesulfide (PPS), polyallylate, polyimide (PI), polycarbonate (PC), cellulosetriacetate (CAT), cellulose acetate propionate (CAP), and a combination thereof. The substrate 101 may include a metal material. The substrate 101 may be vulnerable to moisture.

A buffer film 102 may be disposed between the substrate 101 and the driving transistor DT and between the substrate 101 and the switching transistor ST. The buffer film 102 may be disposed between the substrate 101 and the driving transistor DT and between the substrate 101 and the switching transistor ST so as to protect the driving transistor DT, the switching transistor ST, and light emitting elements from moisture penetrating through the substrate 101. The buffer film 102 may be formed of laminated inorganic films. The laminated inorganic films of the buffer film 102 may be alternately stacked on each other. For example, the buffer film 102 may be formed of a multi-layer film in which one or more inorganic layers including one or more of a silicon oxide (SiOx), a silicon nitride (SiNx), and SiON are alternately stacked. In other embodiments, the buffer film 102 may be omitted.

The first active layer 131 and the second active layer 132 may be disposed on the buffer film 102. The first active layer 131 and the second active layer 132 may be in direct contact with the buffer film 102. The first active layer 131 may include a source region 131a, a drain region 131b, and a channel region 131c. The second active layer 132 may include a source region 132a, a drain region 132b, and a channel region 132c. The channel region 131c may be disposed between the source region 131a and the drain region 131b. The channel region 132c may be disposed between the source region 132a and the drain region 132b. Each of the first active layer 131 and the second active layer 132 may be an oxide semiconductor layer. Each of the first active layer 131 and the second active layer 132 may be formed of indium-gallium-tin oxide (IGTO), indium-gallium-zinc oxide (IGZO), or indium-gallium-zinc-tin oxide (IGZTO), but the material thereof is not limited thereto.

A gate insulating film 120 may be disposed on each of the first active layer 131 and the second active layer 132. The gate insulating film 120 may be formed as an inorganic film, for example, a silicon oxide (SiOx) film, a silicon nitride (SiNx) film, or a multi-layer film thereof.

The first gate electrode 111 may be disposed on the gate insulating film 120, and the second gate electrode 112 may be disposed on the gate insulating film 120. Each of the first gate electrode 111 and the second gate electrode 112 may be formed of a single layer or a multi-layer including any one of molybdenum (Mo), aluminum (Al), chromium (Cr), gold (Au), titanium (Ti), nickel (Ni), neodymium (Nd), and copper (Cu), or an alloy thereof.

The first active layer 131 may overlap the first gate electrode 111 in the third direction (Z-axis direction). The gate insulating film 120 may be disposed between the first active layer 131 and the first gate electrode 111. The second active layer 132 may overlap the second gate electrode 112 in the third direction (Z-axis direction). The gate insulating film 120 may be disposed between the second active layer 132 and the second gate electrode 112. The channel region 131c of the first active layer 131 may overlap the first gate electrode 111 in the third direction (Z-axis direction), and the source region 131a and drain region 131b of the first active layer 131 may not overlap the first gate electrode 111 in the third direction (Z-axis direction). The channel region 132c of the second active layer 132 may overlap the second gate electrode 112 in the third direction (Z-axis direction), and the source region 132a and drain region 132b of the second active layer 132 may not overlap the second gate electrode 112 in the third direction (Z-axis direction).

The gate insulating film 120 may be disposed between the channel region 131c of the first active layer 131 and the first gate electrode 111 in the driving transistor DT. The gate insulating film 120 may be disposed between the channel region 132c of the second active layer 132 and the second gate electrode 112 in the switching transistor ST. However, their configuration and structures are not limited thereto. In other embodiments, a part of the gate insulating film 120 may extend toward the source region 131a and drain region 131b of the first active layer 131 in the driving transistor DR, and may extend toward the source region 132a and drain region 132b of the second active layer 132 in the switching transistor ST.

Although it is illustrated in FIG. 6 that the gate insulating film 120 is disposed only between the first gate electrode 111 and the first active layer 131, their configurations are not limited thereto. In other embodiments, the gate insulating film 120 may be formed on the upper surface and side surfaces of the first active layer 131.

As described above, when each of the driving transistor DT and the switching transistor ST is formed to have a top gate structure, there are advantages that reliability to positive bias stress is excellent and characteristic deviations of the driving transistors DT and the switching transistors ST can be reduced or minimized, compared to when each of the driving transistor DT and the switching transistor ST is formed to have a bottom gate structure.

A second insulating film 163 may be disposed on the first gate electrode 111 of the driving transistor DT. The second insulating film 163 may be formed of a silicon oxide (SiOx) film. The second insulating film 163 may be in direct contact with the upper and side surfaces of the first gate electrode 111 and the side surfaces of the gate insulating film 120. The first gate electrode 111 and the gate insulating film 120 may be covered by the second insulating film 163. In an embodiment, the upper and side surfaces of the first gate electrode 111 and the side surfaces of the gate insulating film 120 may be entirely covered by the second insulating film 163. In other embodiments, the upper and side surfaces of the first gate electrode and the side surfaces of the gate insulating film may be partially covered by the second insulating film 163. The second insulating film 163 may overlap the first active layer 131 to be in direct contact with the first active layer 131. The driving transistor DT may be covered by the second insulating film 163 formed of a silicon oxide (SiOx) film, thereby increasing the driving range of the driving transistor DT. Accordingly, it is possible to increase or improve the stain reducing effect in a display device implementing high resolution display.

The second insulating film 163 may be provided with a first contact hole CT1 penetrating the second insulating film 163 to expose a part of an upper surface of the first active layer 131 and a second contact hole CT2 penetrating the second insulating film 163 to expose another part of the upper surface of the first active layer 131. The first contact hole CT1 may be formed to expose the first source region 131a of the first active layer 131. The second contact hole CT2 may be formed to expose the first drain region 131b of the first active layer 131.

A first source electrode 141 and a first drain electrode 151 may be disposed on the second insulating film 163. The first source electrode 141 may be electrically connected or in contact with the first source region 131a formed on one side of the first active layer 131 through the first contact hole CT1. The first drain electrode 151 may be electrically connected with or in contact with the first drain region 131b formed on another side of the first active layer 131 through the second contact hole CT2.

A first insulating film 161 may be disposed on the second gate electrode 112 of the switching transistor ST. The first insulating film 161 may be formed of a silicon nitride (SiNx) film. The first insulating film 161 may be in direct contact with the upper and side surfaces of the second gate electrode 112 and the side surface of the gate insulating film 120. The second gate electrode 112 and the gate insulating film 120 may be covered by the first insulating film 161. In an embodiment, the upper and side surfaces of the second gate electrode 112 and the side surfaces of the gate insulating film 120 may be entirely covered by the first insulating film 161. In other embodiments, the upper and side surfaces of the second gate electrode 112 and the side surfaces of the gate insulating film 120 may be partially covered by the first insulating film 161. The first insulating film 161 may overlap the second active layer 132 to be in direct contact with the second active layer 132. The switching transistor ST may be covered by the first insulating film 161 formed of a silicon nitride (SiNx) film, thereby increasing the mobility of the switching transistor ST to improve the on-off characteristics of the switching transistor ST.

In order to improve the mobility of the switching transistor ST, the first insulating film 161 may be selectively disposed in an area where the second gate electrode 112 and the second active layer 132 of the switching transistor ST are located. The length of the first insulating film 161 in the first direction (X-axis direction) may be greater than the length of the second active layer 132 in the first direction (X-axis direction). However, the embodiments are not limited thereto. In other examples, the length of the first insulating film 161 in the first direction (X-axis direction) may be equal to the length of the second active layer 132 in the first direction (X-axis direction).

The second insulating film 163 may be disposed on the first insulating film 161. The second insulating film 163 formed of a silicon oxide (SiOx) film may cover the first insulating film 161. The first insulating film 161 formed of a silicon nitride (SiNx) film may cover the second gate electrode 112 and second active layer 132 of the switching transistor ST. Accordingly, the second gate electrode 112 and second active layer 132 of the switching transistor ST may be in contact only with the first insulating film 161, and may not be in contact with the second insulating film 163.

The second insulating film 163 may be in contact with the first insulating film 161 and the buffer film 102. For example, the second insulating film 163 may be in contact with the upper and side surfaces of the first insulating film 161 and the upper surface of the buffer film 102. The second insulating film 163 disposed on the buffer film 102 may have a third thickness D3, and the second insulating film 163 disposed on the first insulating film 161 may have a second thickness D2. The second thickness D2 may be smaller than the third thickness D3. Herein, reference to a first thickness D1, a second thickness D2, and a third thickness D3 may be defined as lengths in the third direction (Z-axis direction).

The second thickness D2 of the second insulating film 163 may be smaller than a first thickness D1 of the first insulating film 161. However, the embodiments are not limited thereto. In other embodiments, the second thickness D2 of the second insulating film 163 may be equal to the first thickness D1 of the first insulating film 161. Also, the second thickness D2 of the second insulating film 163 may be greater than the first thickness D1 of the first insulating film 161. In consideration of the purposes of an increase in mobility of the switching transistor ST to improve the on-off characteristics of the switching transistor ST and a limitation in thicknesses of the first insulating film 161 and the second insulating film 163, it may be preferable that the first thickness D1 of the first insulating film 161 is formed to be thicker than the second thickness D2 of the second insulating film 163. Here, the first thickness D1, the second thickness D2, and the third thickness D3 may be defined as distances in the third direction (Z-axis direction).

A third contact hole CT3 may penetrate the first insulating film 161 and the second insulating film 163 to expose a part of the upper surface of the second active layer 132. A fourth contact hole CT4 may penetrate the first insulating film 161 and the second insulating film 163 to expose another part of the upper surface of the second active layer 132. The third contact hole CT3 may be formed to expose the second source region 132a of the second active layer 132, and the fourth contact hole CT4 may be formed to expose the second drain region 132b of the second active layer 132. The third contact hole CT3 may include a third-first contact hole CT3a formed in the first insulating film 161 and a third-second contact hole CT3b formed in the second insulating film 163. The third-first contact hole CT3a and the third-second contact hole CT3b may overlap each other in the third direction (Z-axis direction). The fourth contact hole CT4 may include a fourth-first contact hole CT4a formed in the first insulating film 161 and a fourth-second contact hole CT4b formed in the second insulating film 163. The fourth-first contact hole CT4a and the fourth-second contact hole CT4b may overlap each other in the third direction (Z-axis direction).

A second source electrode 142 and a second drain electrode 152 may be disposed on the second insulating film 163. The second source electrode 142 may be in contact with the second source region 132a formed on one side of the second active layer 132 through the third contact hole CT3. The second drain electrode 152 may be in contact with the second drain region 132b formed on the other side of the second active layer 132 through the fourth contact hole CT4.

Each of the first source electrode 141, the second source electrode 142, the first drain electrode 151, and the second drain electrode 152 may be formed of a single layer or a multi-layer including any one of zinc indium oxide (ZIO), molybdenum (Mo), aluminum (Al), chromium (Cr), gold (Au), titanium (Ti), nickel (Ni), neodymium (Nd), and copper (Cu), or an alloy thereof. For example, each of the first source electrode 141, the second source electrode 142, the first drain electrode 151, and the second drain electrode 152 may be formed to have a laminated structure of zinc indium oxide-copper-zinc indium oxide (ZIO—Cu—ZIO).

The distance between the first active layer 131 and each of the first source electrode 141 and the first drain electrode 151 in the third direction (Z-axis direction) may be equal to the distance between the second active layer 132 and each of the second source electrode 142 and the second drain electrode 152 in the third direction (Z-axis direction). However, the embodiments are not limited thereto. In other examples, the distance between the second active layer 132 and each of the second source electrode 142 and the second drain electrode 152 in the third direction (Z-axis direction) may be greater than the distance between the first active layer 131 and each of the first source electrode 141 and the first drain electrode 151 in the third direction (Z-axis direction).

A protection film 170 may be formed on each of the first source electrode 141, the second source electrode 142, the first drain electrode 151, and the second drain electrode 152. The protective film 170 may be formed of an inorganic film, for example, a silicon oxide film (SiOx), a silicon nitride film (SiNx), or a multi-layered film thereof.

A planarization film 180 of a planarizing the step caused by a thin film transistor such as the driving transistor DT or the switching transistor ST may be formed on the protective film 170. The planarization film 180 may be an organic film formed of an acrylic resin, an epoxy resin, a phenolic resin, a polyamide resin, or a polyimide resin.

A light emitting element EL including a first electrode 191, an organic light emitting layer 192, and a second electrode 193, and a pixel defining film 195 may be formed on the planarization film 180. The first electrode 191 may be formed on the planarization layer 180. The first electrode 191 may be connected to the first source electrode 141 of the driving transistor DT through a contact hole penetrating the protective film 170 and the planarization film 180. The pixel defining film 195 may be formed to cover the edge of the first electrode 191 on the planarization layer 180 so as to define the pixels. The pixel defining film 195 may serve to define the pixels. Each of the pixels may indicate an area where the first electrode 191, the organic light emitting layer 192, and the second electrode 193 are sequentially laminated, and thus holes from the first electrode 191 are combined with electrons from the second electrode 193 to emit light. The organic light emitting layer 192 may be formed on the first electrode 191 and the pixel defining film 195. The organic light emitting layer 192 may include a hole transporting layer, a light emitting layer, and an electron transporting layer. Further, the organic light emitting layer 192 may be formed in a tandem structure of two stacks or more, and a charge generating layer may be formed between the stacks. The second electrode 193 is formed on the organic light emitting layer 192. The second electrode 193 may be a common layer formed commonly in the pixels.

The light emitting elements EL may be formed by a top emission manner in which light is emitted toward a second substrate, that is, in an upward direction. The first electrode 191 may be formed of a high-reflectance metal material such as a laminate structure (Ti/Al/Ti) of aluminum and titanium, a laminate structure (ITO/Al/ITO) of aluminum and TIO, an APC alloy, or a laminate structure (ITO/APC/ITO) of an APC alloy and ITO. The APC alloy may be an alloy of silver (Ag), palladium (Pd), and copper alloy (Cu). The second electrode 193 may be formed of a transparent conductive material (TCO) such as ITO or IZO, which is light-transmissive, or a semi-transmissive conductive material such as magnesium (Mg), silver (Ag), or an alloy of magnesium (Mg) and silver (Ag). When the second electrode 193 is formed of a semi-transmissive metal material, light emission efficiency may be increased by microcavities.

An encapsulation layer 196 for preventing the penetration of oxygen or moisture may be formed on the second electrode 193. The encapsulation layer 196 may include an inorganic film. The inorganic film may be formed of silicon nitride, aluminum nitride, zirconium nitride, titanium nitride, hafnium nitride, tantalum nitride, silicon oxide, aluminum oxide, or titanium oxide. The encapsulation layer 196 may further include an organic film in order to prevent foreign matter (particles) from penetrating the encapsulation layer 196 and entering the organic light emitting layer 192 and the second electrode 193. The organic film may be formed of epoxy, acrylate, or urethane acrylate.

As described above, the driving transistor DT may be provided with the second insulating film 163 formed of a silicon oxide (SiOx) film, and the switching transistor is provided with the first insulating film 161 formed of the silicon nitride (SiNx) film and the second insulating film 163 formed of a silicon oxide (SiOx) film. Accordingly, the driving range of the driving transistor DT may increase, and simultaneously the mobility of the switching transistor ST may increase, thereby improving the on-off characteristics of the switching transistor ST.

Each of the pull-up transistor TU and pull-down transistor TD of the scan driving circuit SDC and the transistors of the node controller NC may include a third gate electrode, a third active layer, a third source electrode, and a third drain electrode. Each of the pull-up transistor TU and pull-down transistor TD of the scan driving circuit SDC and the transistors of the node controller NC may have substantially the same structure as the switching transistor ST shown in FIGS. 7 and 8. The first insulating film 161 formed of a silicon nitride (SiNx) film and the second insulating film 163 formed of a silicon oxide film (SiOx) may be disposed on the transistors. The third gate electrode, third active layer, third source electrode and third drain electrode of each of the pull-up transistor TU and pull-down transistor TD of the scan driving circuit SDC and the transistors of the node controller NC may be substantially the same as the second gate electrode 112, second active layer 132, second source electrode 142 and second drain electrode 152 of the switching transistor ST described with FIGS. 7 and 8. Accordingly, a detailed description thereof will be omitted. The transistors of the scan driving circuit SDC may be formed like the switching transistor ST, and thus on-off characteristics of the transistors of the scan driving circuit SDC may be improved.

Figure 9:
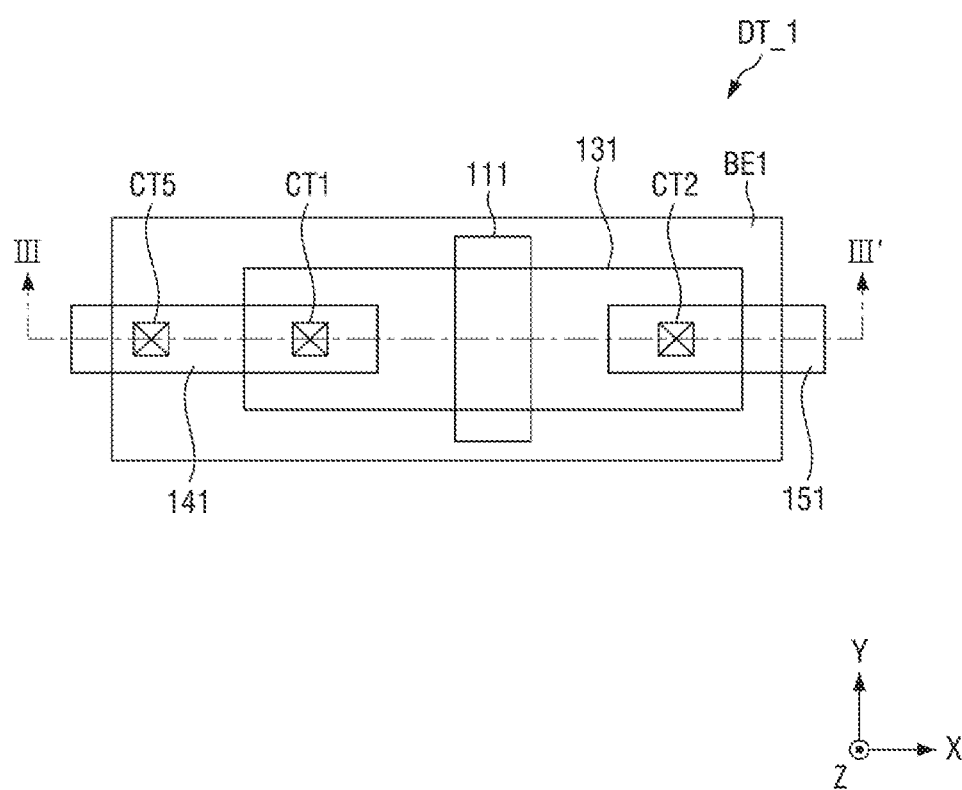
FIG. 9 is a plan view showing another example of a driving transistor of the pixel of FIG. 3.
Figure 10:
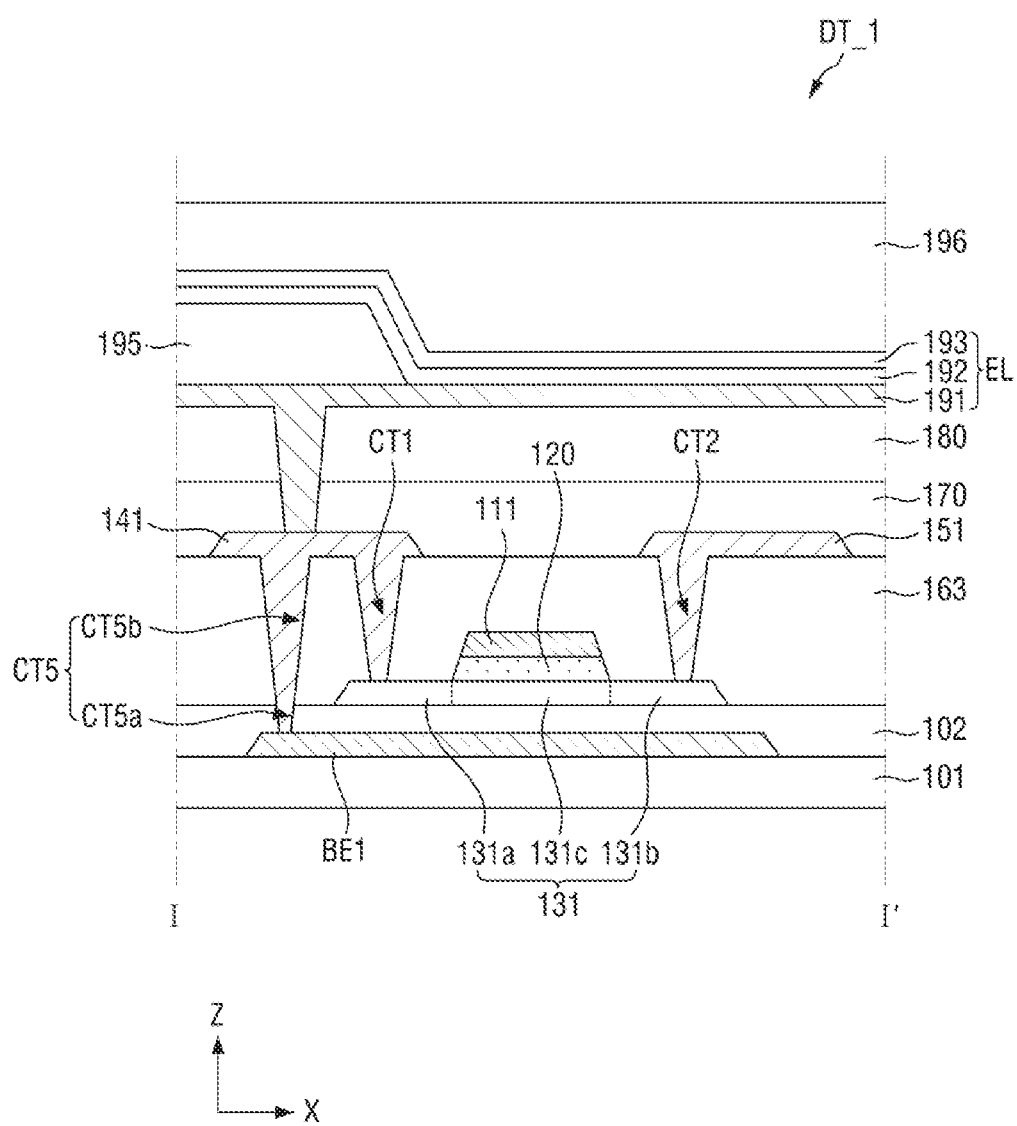
FIG. 10 is a cross-sectional view taken along the line III-III' of FIG. 9.
Figure 11:
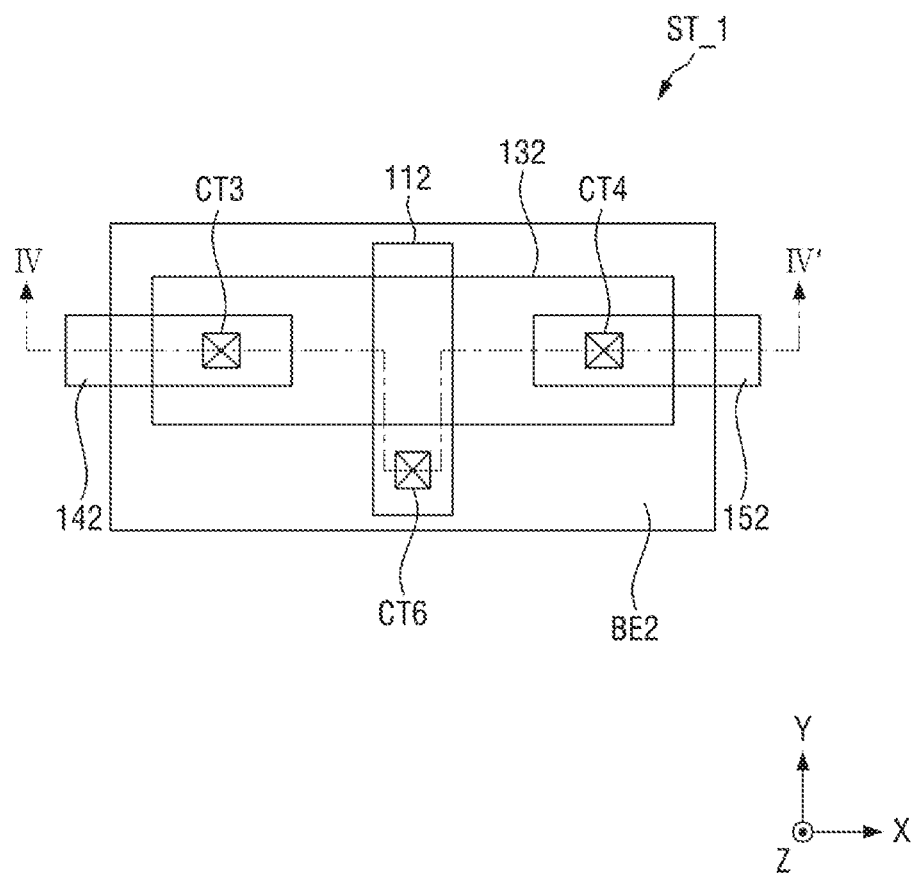
FIG. 11 is a plan view showing another example of a switching transistor of the pixel of FIG. 3.
Figure 12:
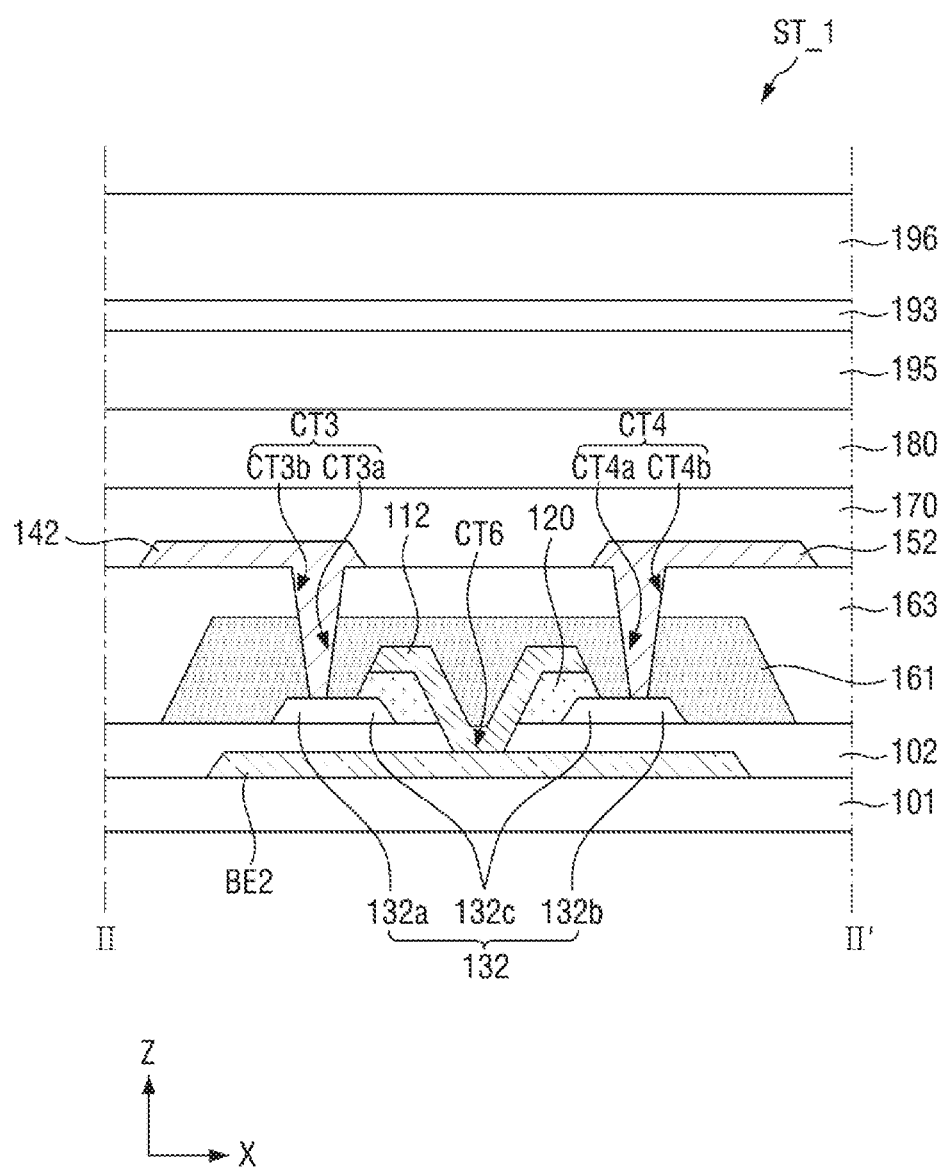
FIG. 12 is a cross-sectional view taken along the line IV-IV' of FIG. 11.

FIG. 9 is a plan view showing another example of a driving transistor of the pixel. FIG. 10 is a cross-sectional view taken along the line III-III' of FIG. 9. FIG. 11 is a plan view showing another example of a switching transistor of the pixel. FIG. 12 is a cross-sectional view taken along the line IV-IV' of FIG. 11.

The embodiment of FIGS. 9 to 13 may be different from the embodiment of FIGS. 5 to 8 in that a driving transistor DT_1 may include a lower metal layer BE1 and a switching transistor ST_1 may include a lower metal layer BE2. Hereinafter, a detailed description duplicating that of the embodiment of FIGS. 5 to 8 will be omitted, and differences will be focused upon.

Referring to FIGS. 9 to 12, each of the driving transistor DT_1 and the switching transistor ST_1 may be disposed on the first substrate 101. For example, the first lower metal layer BE1 may be disposed under the first active layer 131, and the second lower metal layer BE2 may be disposed under the second active layer 132. Each of the first lower metal layer BE1 and the second lower metal layer BE2 may be located between the first substrate 101 and the buffer film 102.

With respect to the driving transistor DT_1, the buffer film 102 and second insulating film 163 may be provided with a fifth contact hole CT5 penetrating the buffer film 102 and the second insulating film 163 to expose the first lower metal layer BE1. The fifth contact hole CT5 may include a fifth-first contact hole CT5a formed in the buffer film 101 and a fifth-second contact hole CT5b formed in the second insulating film 163. The fifth-first contact hole CT5a and the fifth-second contact hole CT5b may overlap each other in the third direction (Z-axis direction). The fifth contact hole CT5 may be aligned with the first contact hole CT1 and the second contact hole CT2 in the first direction (X-axis direction). The fifth contact hole CT5 may not overlap the first active layer 131 in the third direction (Z-axis direction). The first lower metal layer BE1 may be formed of a single layer or a multi-layer including any one of molybdenum (Mo), aluminum (Al), chromium (Cr), gold (Au), titanium (Ti), nickel (Ni), neodymium (Nd), and copper (Cu), or an alloy thereof.

The length of the first lower metal layer BE1 in the first direction (X-axis direction) may be greater than the length of the first active layer 131 in the first direction (X-axis direction). However, the embodiments are not limited thereto. In other examples, the length of the first lower metal layer BE1 in the first direction (X-axis direction) may be smaller than the length of the first active layer 131 in the first direction (X-axis direction), and the length of the first lower metal layer BE1 in the first direction (X-axis direction) may also be equal to the length of the first active layer 131 in the first direction (X-axis direction).

The first source electrode 141 may be in contact with the first lower metal layer BE1 through the fifth contact hole CT5. The first lower metal layer BE1 disposed under the first active layer 131 has the same voltage as the first source electrode 141. When the first lower metal layer BE1 and the first source electrode 141 have the same potential, the first active layer 131 adjacent to the first lower metal layer BE1 may not be activated as compared with the first active layer 131 adjacent to the first gate electrode 111. That is, since the electron mobility of the channel region 131c of the first active layer 131 may be reduced, the driving range of the driving transistor DT_1 can be prevented or reduced even when the driving current of each of the pixels is reduced as the number of pixels in a high-resolution display device increases.

With respect to the switching transistor ST_1, the buffer film 102 and gate insulating film 120 may be provided with a sixth contact hole CT6 penetrating the buffer film 102 and the gate insulating film 120 to expose the second lower metal layer BE2. The sixth contact hole CT6 may not be aligned with the third contact hole CT3 and the fourth contact hole CT4 in the first direction (X-axis direction), and the sixth contact hole CT6 may not overlap the second active layer 132 in the third direction (Z-axis direction). The second lower metal layer BE2 may be formed of a single layer or a multi-layer including any one of molybdenum (Mo), aluminum (Al), chromium (Cr), gold (Au), titanium (Ti), nickel (Ni), neodymium (Nd), and copper (Cu), or an alloy thereof.

The length of the second lower metal layer BE2 in the first direction (X-axis direction) may be greater than the length of the second active layer 132 in the first direction (X-axis direction). However, the embodiments are not limited thereto. In other examples, the length of the second lower metal layer BE2 in the first direction (X-axis direction) may be smaller than the length of the second active layer 132 in the first direction (X-axis direction), and the length of the second lower metal layer BE2 in the first direction (X-axis direction) may also be equal to the length of the second active layer 132 in the first direction (X-axis direction).

The second gate electrode 112 may be in contact with the second lower metal layer BE2 through the sixth contact hole CT6. The second lower metal layer BE2 disposed under the second active layer 132 has the same voltage as the second gate electrode 112. That is, the second gate electrode 112 may serve as an upper gate electrode, and the second lower metal layer BE2 may serve as a lower gate electrode. Therefore, since the switching transistor ST_1 can be driven by a double gate method, a leakage current can be prevented or reduced from flowing into the channel region 132c of the second active layer 132 of the switching transistor ST_1 when the switching transistor ST_1 is turned off, and thus characteristics of the switching transistor ST_1 can be improved.

Subsequently, a method of manufacturing a display device according to an example will be described. A method of manufacturing the display device of FIGS. 1 to 8 will be described as an example of varying embodiments. Components substantially the same as those in FIGS. 1 to 8 are denoted by the same reference numerals, and a detailed description thereof will be omitted.

FIGS. 13 to 20 are cross-sectional views of steps of a method of manufacturing a display device according to an example, and FIG. 21 is a flow chart to explain the method of manufacturing a display device according to the example of FIGS. 13-20. FIGS. 13 to 20 include the cross-sectional view taken along the line I-I' of FIG. 6 and the cross-sectional view taken along the line II-II' of FIG. 8.

Figure 13:
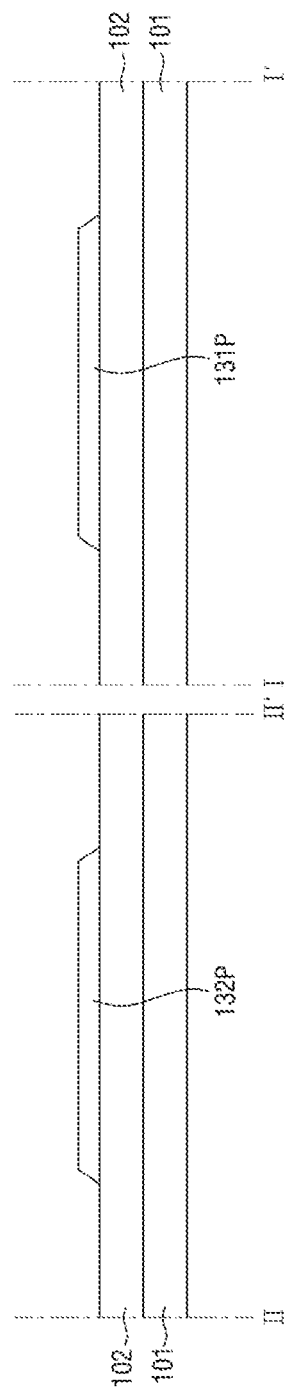
FIGS. 13 to 20 are cross-sectional views of steps of a method of manufacturing a display device according to an embodiment.

Referring to FIGS. 13 and 21, in the method of manufacturing a display device according to an example, a buffer film 102 may be formed on a substrate 101 to protect the driving transistor DT and switching transistor ST of a pixel PX from moisture passing through the substrate 101, and a first active pattern 131P and a second active pattern 132P may be formed on the buffer film 102 (S10). The first active pattern 131P and the second active pattern 132P may be made of an oxide semiconductor. For example, the first active pattern 131P and the second active pattern 132P may be made of an oxide semiconductor including tin (Sn). The oxide semiconductor including tin (Sn) may be an indium-gallium-tin oxide (IGTO) or an indium-gallium-zinc-tin oxide (IGZTO). The first active pattern 131P and the second active pattern 132P may be formed by a sputtering method.

The first active pattern 131P and the second active pattern 132P may be formed by patterning the first active pattern 131P and the second active pattern 132P by an etching process using a photoresist pattern. The first active pattern 131P and the second active pattern 132P may be patterned by wet etching or dry etching. The photoresist pattern may form the first active pattern 131P and the second active pattern 132P through a strip process. In the interest of economical processing, a number of masks may be maintained by patterning the first active pattern 131P and the second active pattern 132P at the same time.

Figure 14:
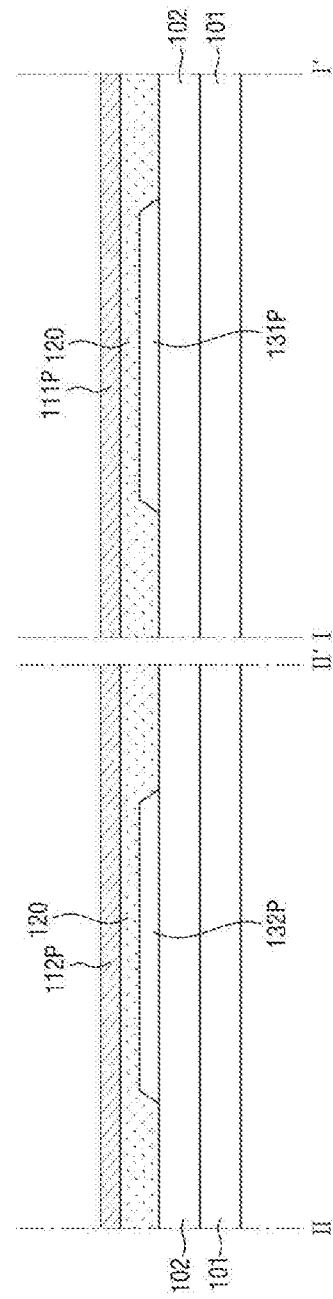

Referring to FIGS. 14 and 21, a gate insulating film 120 and gate electrode layers 111P and 112P may be formed on the first active pattern 131P and the second active pattern 132P (S20). The gate insulating film 120 may be formed of an inorganic film such as a silicon oxide film (SiOx) film or a silicon nitride (SiNx) film, or a multi-layered film thereof. The gate insulating film 120 may be formed by chemical vapor deposition.

Each of the gate electrode layers 111P and 112P may be formed of a single layer or multiple layer including any one of molybdenum (Mo), aluminum (Al), chromium (Cr), gold (Au), titanium (Ti), nickel (Ni), neodymium (Nd), and copper (Cu), or an alloy thereof. The gate insulating film 120 may be formed by a sputtering method.

Figure 15:
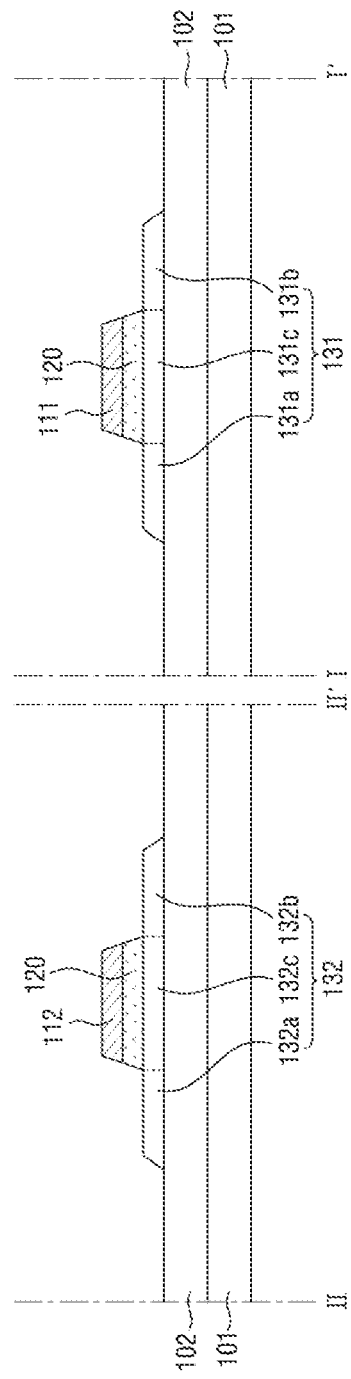

Referring to FIGS. 15 and 21, a first gate electrode 111, a second gate electrode 112, a first active layer 131, and a second active layer 132 may be formed (S30). The gate electrode layers 111P and 112P may be patterned by an etching process using a photoresist pattern, thereby forming the first gate electrode 111 and the second gate electrode 112. The gate insulating film 120 may be etched by using the first gate electrode 111 and the second gate electrode 112 as masks, thereby patterning the gate insulating film 120 and simultaneously forming the first active layer 131 including a source region 131a, a drain region 131b and a channel region 131c and the second active layer 132 including a source region 132a, a drain region 132b and a channel region 132c.

Figure 16:
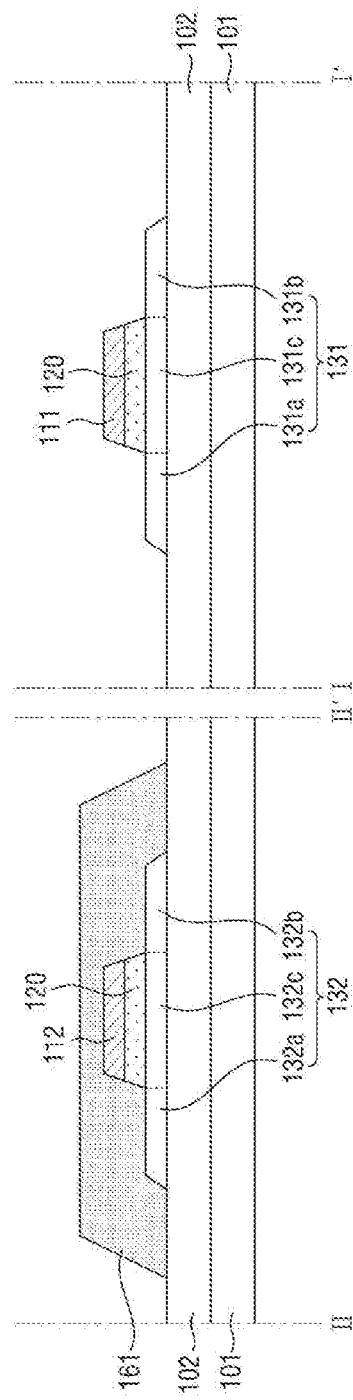

Referring to FIGS. 16 and 21, a first insulating film 161 may be formed to cover the second active layer 132 and the second gate electrode 112 (S40). The first insulating film 161 may be formed of a silicon nitride (SiNx) film, and the first insulating film 161 may be formed by chemical vapor deposition. The first insulating film 161 may cover the upper and side surfaces of the second gate electrode 112, the side surface of the gate insulating film 120, and the upper and side surfaces of the second active layer 132. Further, the first insulating film 161 may cover a part of the buffer film 102.

As described above, the first insulating film is formed only in the area where a switching transistor ST may be disposed.

Figure 17:
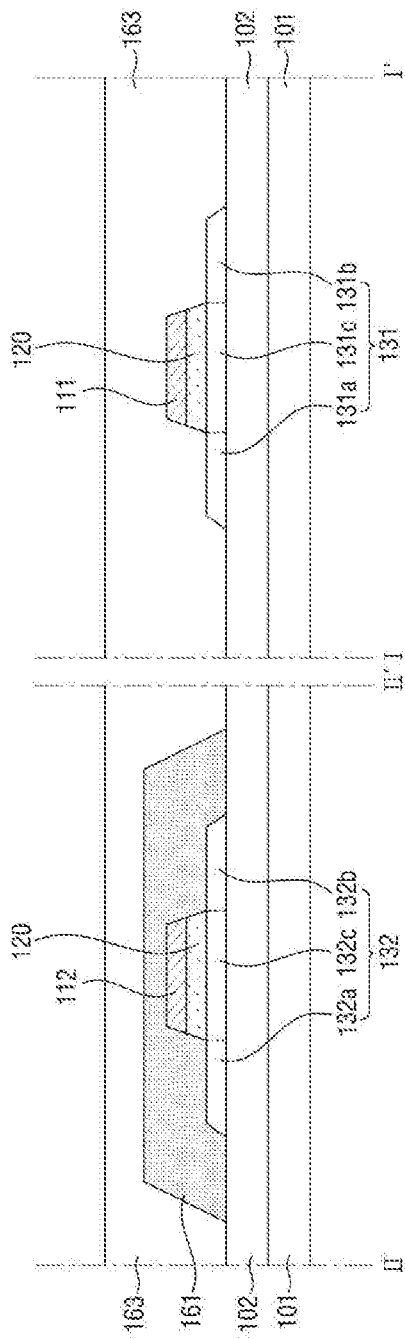

Referring to FIGS. 17 and 21, a second insulating film 163 may be formed to cover the first active layer 131, the first gate electrode 111, and the first insulating film 161 (S50). The second insulating film 163 may be formed of a silicon oxide (SiNx) film, and the second insulating film 163 may be formed by chemical vapor deposition. The second insulating film 163 may cover the upper and side surfaces of the first gate electrode 111, the side surface of the gate insulating film 120, the upper and side surfaces of the first active layer 132, and the upper and side surfaces of the first insulating film 161. Further, the second insulating film 163 may cover a part of the buffer film 102. As described above, the second insulating film 163 may be formed in the area where the switching transistor ST is disposed and the area where the driving transistor DT is disposed.

Figure 18:
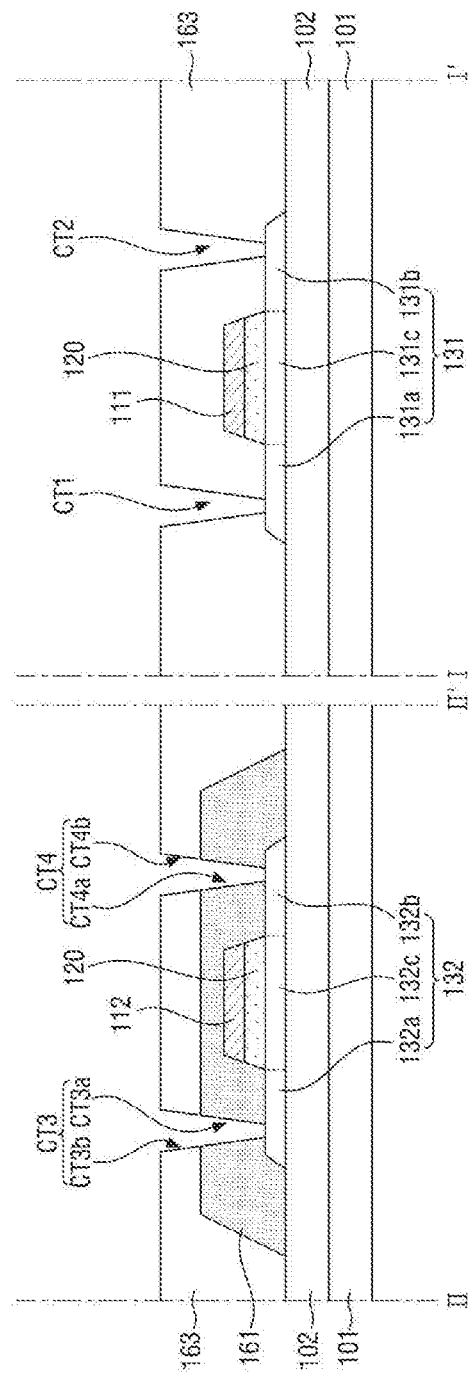

Referring to FIGS. 18 and 21, first to fourth contact holes CT1, CT2, CT3, and CT4 may be formed (S60). Specifically, a first contact hole CT1 may be formed penetrating the second insulating film 163 to expose a part of the upper surface of the first active layer 131. A second contact hole CT2 may be formed penetrating the second insulating film 163 to expose another part of the upper surface of the first active layer 131. A third contact hole CT3 may be formed penetrating the first insulating film 161 and the second insulating film 163 to expose a part of the upper surface of the second active layer 132. A fourth contact hole CT4 may be formed penetrating the first insulating film 161 and the second insulating film 163 to expose another part of the upper surface of the second active layer 132.

Figure 19:
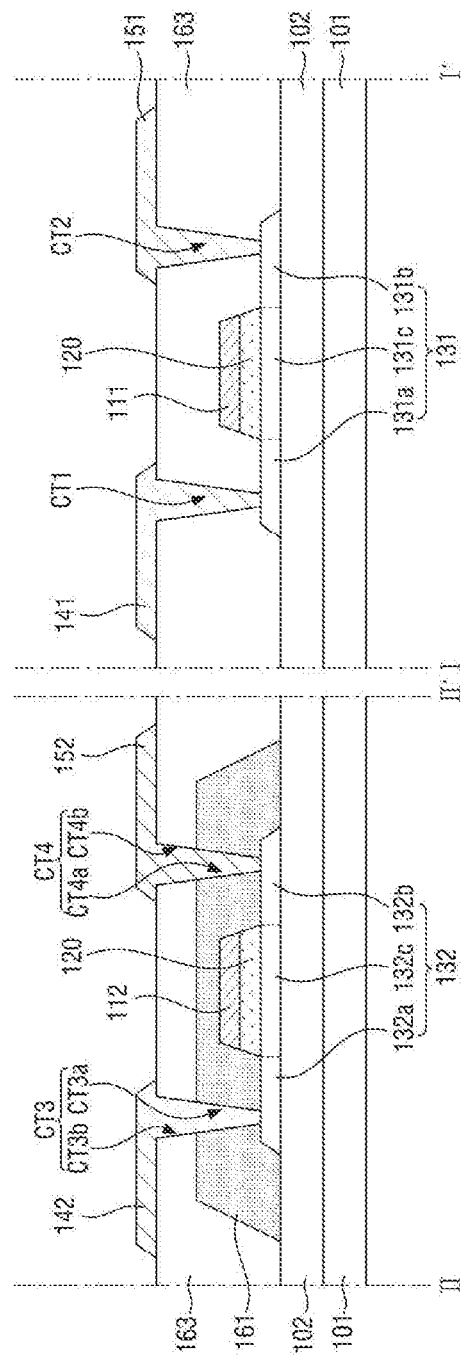

Referring to FIGS. 19 and 21, a first source electrode 141, a second source electrode 142, a first drain electrode 151, and a second drain electrode 152 may be formed on the second insulating film 163 (S70). The first source electrode 141, the second source electrode 142, the first drain electrode 151, and the second drain electrode 152 may be formed of a single layer or multiple layer including any one of molybdenum (Mo), aluminum (Al), chromium (Cr), gold (Au), titanium (Ti), nickel (Ni), neodymium (Nd), and copper (Cu), or an alloy thereof. The first source electrode 141, the second source electrode 142, the first drain electrode 151, and the second drain electrode 152 may be formed by patterning a source drain metal layer formed on the front surface of the second insulating film 160 by a sputtering method by an etching process using a photoresist pattern.

The first source electrode 141 may be formed to be in contact with the first source region 131a formed at one side of the first active layer 131 through the first contact hole CT1. The first drain electrode 151 may be formed to be in contact with the first drain region 131b formed at the other side of the first active layer 131 through the second contact hole CT2.

The second source electrode 142 may be formed to be in contact with the second source region 132a formed at one side of the second active layer 132 through the third contact hole CT3. The second drain electrode 152 may be formed to be in contact with the second drain region 132b formed at the other side of the second active layer 132 through the fourth contact hole CT4.

Figure 20:
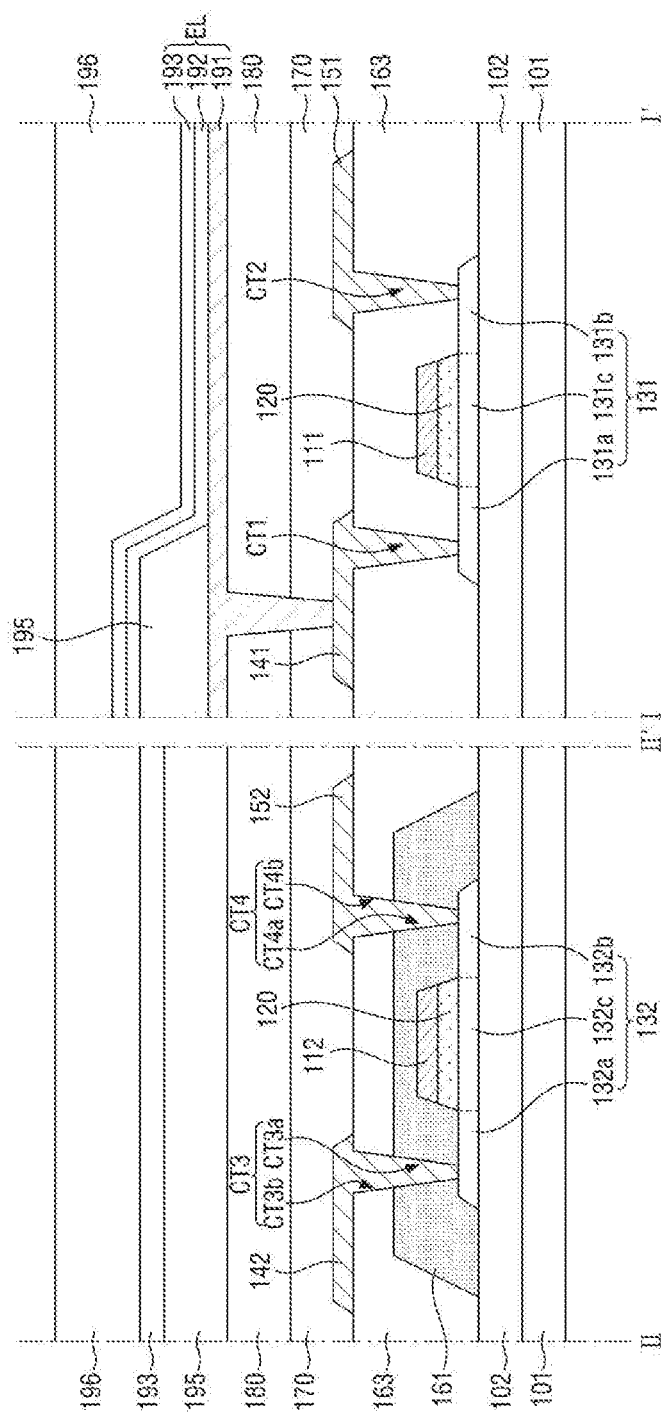

Referring to FIGS. 20 and 21, a protective film 170 and a planarization film 180 may be formed on the source electrodes 141 and 142 and drain electrodes 151 and 152 (S80). The protective film 170 may be formed of an inorganic film such as a silicon oxide (SiOx) film or a silicon nitride (SiNx) film, or a multi-layered film thereof, and may be formed by chemical vapor deposition. The planarization film 180 may be formed of an organic film including an acrylic resin, an epoxy resin, a phenol resin, a polyamide resin, or a polyimide resin, and may be formed by chemical vapor deposition. A light emitting element EL and a pixel defining film 195 may be formed on the planarization film 180.

A method of manufacturing the display device of the example of FIGS. 9 to 12 may be similar to the method of FIGS. 13-21. This similarity may result since the example of FIGS. 9 to 12 may be the same as the example of FIGS. 13 to 21 except that lower metal layers BE1 and BE2 may be disposed between the first active layer 131, and the second active layer 132 and a fifth hole CT5 and a sixth contact hole CT6 may be formed. Accordingly, a redundant description will be omitted.

The second insulating film 163 formed of a silicon oxide (SiOx) film may be disposed on the driving transistor DT, and the first insulating film 161 formed of a silicon nitride (SiNx) film and the second insulating film 163 formed of a silicon oxide (SiOx) film may be disposed on the switching transistor ST. Accordingly, the driving range of the driving transistor DT can be increased, and simultaneously the mobility of the switching transistor ST can be increased, thereby improving the on-off characteristics of the switching transistor ST.

According to examples, it is possible to realize a high-resolution display device capable of improving the mobility of a scan driving circuit and a switching transistor and increasing the driving range of a driving transistor.

In concluding the detailed description, those skilled in the art will appreciate that many variations and modifications can be made to the examples without substantially departing from the principles of this disclosure. Therefore, the disclosed examples are used in a generic and descriptive sense only and not for purposes of limitation.

What is claimed is:
1. A display device, comprising:
a substrate;
a pixel on the substrate connected to a scan line and a data line intersecting the scan line;
a driving transistor disposed in the pixel, the driving transistor including:

a first active layer disposed on the substrate;
a first gate electrode disposed on the first active layer; and
a second insulating film contacting the first active layer and the first gate electrode;
a switching transistor disposed in the pixel, the switching transistor including:
a second active layer disposed on the substrate; and
a second gate electrode disposed on the second active layer;
a first insulating film contacting the second active layer and the second gate electrode; and
a first gate insulating film disposed between the first active layer and the first gate electrode, and between the second active layer and the second gate electrode, wherein
the first insulating film covers the second gate electrode, but does not cover the first active layer and the first gate electrode;
the second insulating film covers the first insulating film and the first gate insulating film, and
the first insulating film is made of a different material than a material of the second insulating film of the driving transistor and the switching transistor.

2. The display device of claim 1, wherein the first insulating film includes a silicon nitride (SiNx) film.

3. The display device of claim 1, wherein the first insulating film is in contact with upper and side surfaces of the second gate electrode and upper and side surfaces of the second active layer.

4. The display device of claim 1, wherein a thickness of the first insulating film is greater than a thickness of the second insulating film of the switching transistor.

5. The display device of claim 1, wherein each of the first active layer and the second active layer includes indium-gallium-tin oxide (IGTO), indium-gallium-zinc oxide (IGZO), or indium-gallium-zinc-tin oxide (IGZTO).

6. The display device of claim 1, further comprising:
a scan driving circuit outputting a scan signal to the scan line,
wherein the scan driving circuit includes a pull-up transistor that outputs a gate-on voltage in response to a pull-up node being charged with the gate-on voltage, and the pull-up transistor includes:
a third active layer disposed on a same layer as the second active layer; and
a third gate electrode disposed on the second active layer.

7. The display device of claim 6, wherein the third active layer includes indium-gallium-tin oxide (IGTO), indium-gallium-zinc oxide (IGZO), or indium-gallium-zinc-tin oxide (IGZTO).

8. The display device of claim 1, wherein;
the driving transistor further includes a first lower metal layer disposed between the substrate and the first active layer, and
the switching transistor further includes a second lower metal layer disposed between the substrate and the second active layer.

9. The display device of claim 8, wherein:
a length of the first lower metal layer in a first direction is greater than a length of the first active layer in the first direction, and
a length of the second lower metal layer in the first direction is greater than a length of the first active layer in the first direction.

10. The display device of claim 8, wherein
the first active layer includes a first source region, a first drain region, and a first channel region disposed between the first source region and the first drain region, and
the second active layer includes a second source region, a second drain region, and a second channel region disposed between the second source region and the second drain region.

11. The display device of claim 10, wherein the driving transistor further includes:
a first source electrode connected to the first source region of the first active layer through a first contact hole penetrating the second insulating film of the driving transistor; and
a first drain electrode connected to the first drain region of the first active layer through a second contact hole penetrating the second insulating film of the driving transistor.

12. The display device of claim 11, wherein the switching transistor further includes:
a second source electrode connected to the second source region of the second active layer through a third contract hole penetrating the first insulating film and the second insulating film of the switching transistor; and
a second drain electrode connected to the second drain region of the second active layer through a fourth contract hole penetrating the first insulating film and the second insulating film of the switching transistor.

13. The display device of claim 12, further comprising:
a buffer film disposed between the first lower metal layer and the first active layer,
wherein the driving transistor further includes a fifth contact hole penetrating the second insulating film of the driving transistor and the buffer film, and the second source electrode is connected to the first lower metal layer through the fifth contact hole.

14. The display device of claim 13, further comprising:
a sixth contact hole exposing the second active layer,
wherein the second gate electrode is connected to the second lower metal layer through the sixth contact hole.

15. The display device of claim 14, wherein the first contact hole, the second contact hole, and the fifth contact hole are aligned in a first direction.

16. The display device of claim 15, wherein:
the third contact hole and the fourth contact hole are aligned in the first direction, and
the sixth contact hole is not aligned with the third contact hole and the fourth contact hole in the first direction.

17. A method of manufacturing a display device, comprising:
forming a first active layer and a second active layer on a substrate;
forming a first gate insulating film on the first active layer and the second active layer;
forming a first gate electrode on the first active layer;
forming a second gate electrode on the second active layer;
forming a first insulating film covering the second active layer and the second gate electrode, the first insulating film not covering the second gate electrode; and
forming a second insulating film covering the first active layer, the first gate electrode, and the first insulting film.

18. The method of claim 17, further comprising:
forming a first lower metal layer between the substrate and the first active layer; and forming a second lower metal layer between the substrate and the first active layer.

19. The display device of claim 17, wherein the first insulating does not cover the second gate electrode.

20. The method of claim 17, wherein the first gate electrode and the second gate electrode are both formed directly on a common layer.

21. The method of claim 17, wherein the first active layer and the second active layer are both formed directly on a common layer.

22. The method of claim 17, wherein each of the first active layer and the second active layer includes indium-gallium-tin oxide (IGTO), indium-gallium-zinc oxide (IGZO), or indium-gallium-zinc-tin oxide (IGZTO).

23. The method of claim 22, wherein:
the first insulating film is formed of a silicon nitride (SiNx) film, and
the second insulating film is formed of a silicon oxide (SiOx) film.

24. A display device, comprising:
a substrate;
an active layer on the substrate, which includes a first active layer and a second active layer;
a gate electrode on the active layer, which includes a first gate electrode on the first active layer and a second gate electrode on the second active layer;
a first insulating film on the gate electrode, which partially covers the second active layer and the second gate electrode; and
a second insulating film on the gate electrode and the first insulating film, which covers the first gate electrode, the first active layer, and the first insulating film, wherein
the first insulating film is made of a different material than a material of the second insulating film of a driving transistor.

* * * * *